United States Patent
Moroz et al.

(10) Patent No.: US 10,411,135 B2
(45) Date of Patent: Sep. 10, 2019

(54) SUBSTRATES AND TRANSISTORS WITH 2D MATERIAL CHANNELS ON 3D GEOMETRIES

(71) Applicant: Synopsys, Inc., Mountain View, CA (US)

(72) Inventors: Victor Moroz, Saratoga, CA (US); Joanne Huang, Mountain View, CA (US); Jamil Kawa, Campbell, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/577,177

(22) PCT Filed: Jun. 8, 2016

(86) PCT No.: PCT/US2016/036482
§ 371 (c)(1),
(2) Date: Nov. 27, 2017

(87) PCT Pub. No.: WO2016/200971
PCT Pub. Date: Dec. 15, 2016

(65) Prior Publication Data
US 2018/0182898 A1    Jun. 28, 2018

Related U.S. Application Data

(60) Provisional application No. 62/172,700, filed on Jun. 8, 2015, provisional application No. 62/242,236, filed on Oct. 15, 2015.

(51) Int. Cl.
*H01L 29/786* (2006.01)
*H01L 29/78* (2006.01)
(Continued)

(52) U.S. Cl.
CPC .... *H01L 29/78696* (2013.01); *H01L 27/0886* (2013.01); *H01L 29/0665* (2013.01);
(Continued)

(58) Field of Classification Search
CPC ................. H01L 29/51; H01L 29/1606; H01L 29/78696
See application file for complete search history.

(56) References Cited

U.S. PATENT DOCUMENTS 6,593,176 B2   7/2003   Dennison
6,706,571 B1   3/2004   Yu et al.
(Continued)

FOREIGN PATENT DOCUMENTS

KR   20050049866 A   5/2005
KR   20120076297 A   7/2012
(Continued)

OTHER PUBLICATIONS

PCT/US2016/036482—International Search Report and Written Opinion dated Sep. 20, 2017, 14 pages.
(Continued)

*Primary Examiner* — Changhyun Yi
(74) *Attorney, Agent, or Firm* — Haynes Beffel & Wolfeld LLP

(57) ABSTRACT

Roughly described, a transistor is formed with a semiconductor 2D material layer wrapped conformally on at least part of a 3D structure. The 3D structure can be for example a ridge made of a dielectric material, or made of dielectric material alternating longitudinally with a semiconductive or conductive material. Alternatively the 3D structure can be tree-shaped. Other shapes are possible as well. Aspects also include methods for making such structures, as well as integrated circuit layouts defining such structures and methods for developing such layouts, a machine readable data storage medium storing design entries which include some
(Continued)

which define such structures and layouts, methods for developing such design entries. Aspects further include corrugated wafers which are prepared as an intermediate product for use in fabricating integrated circuits having a semiconductor 2D material layer disposed conformally on a 3D structure.

47 Claims, 19 Drawing Sheets

(51) Int. Cl.
| | |
|---|---|
| H01L 29/739 | (2006.01) |
| H01L 29/778 | (2006.01) |
| H01L 29/06 | (2006.01) |
| H01L 29/16 | (2006.01) |
| H01L 29/24 | (2006.01) |
| H01L 27/088 | (2006.01) |
| H01L 29/15 | (2006.01) |
| H01L 29/66 | (2006.01) |

(52) U.S. Cl.
CPC ........ *H01L 29/151* (2013.01); *H01L 29/1606* (2013.01); *H01L 29/24* (2013.01); *H01L 29/66742* (2013.01); *H01L 29/7391* (2013.01); *H01L 29/778* (2013.01); *H01L 29/78* (2013.01); *H01L 29/7853* (2013.01); *H01L 29/7854* (2013.01)

(56) References Cited

U.S. PATENT DOCUMENTS

| | | |
|---|---|---|
| 6,812,508 B2 | 11/2004 | Fukumi |
| 7,190,050 B2 | 3/2007 | King et al. |
| 7,224,019 B2 | 5/2007 | Hieda et al. |
| 7,358,142 B2 | 4/2008 | Kang et al. |
| 7,528,465 B2 | 5/2009 | King et al. |
| 7,714,397 B2 | 5/2010 | Hareland et al. |
| 7,960,232 B2 | 6/2011 | King et al. |
| 8,304,760 B2 | 11/2012 | Chen |
| 8,604,518 B2 | 12/2013 | Bhuwalka et al. |
| 8,786,057 B2 | 7/2014 | King et al. |
| 8,815,739 B2 | 8/2014 | Krivokapic et al. |
| 9,658,186 B2 | 5/2017 | Yang et al. |
| 9,711,647 B2 | 7/2017 | van Dal et al. |
| 2004/0099925 A1 | 5/2004 | Poveda |
| 2004/0108559 A1 | 6/2004 | Sugii et al. |
| 2004/0217448 A1 | 11/2004 | Kumagai et al. |
| 2005/0023569 A1 | 2/2005 | Yang |
| 2005/0056892 A1 | 3/2005 | Seliskar |
| 2005/0116218 A1 | 6/2005 | Yang |
| 2005/0202604 A1 | 9/2005 | Cheng et al. |
| 2005/0224800 A1 | 10/2005 | Lindert et al. |
| 2005/0224875 A1 | 10/2005 | Anderson et al. |
| 2005/0224890 A1 | 10/2005 | Bernstein et al. |
| 2005/0239254 A1 | 10/2005 | Chi et al. |
| 2005/0280121 A1 | 12/2005 | Doris et al. |
| 2005/0285186 A1 | 12/2005 | Fujiwara |
| 2006/0113603 A1 | 6/2006 | Currie |
| 2006/0170066 A1 | 8/2006 | Mathew et al. |
| 2007/0292996 A1 | 12/2007 | Abadeer et al. |
| 2009/0020764 A1 | 1/2009 | Anderson |
| 2012/0168723 A1 | 7/2012 | Park |
| 2013/0146846 A1* | 6/2013 | Adkisson .......... H01L 29/66045 257/27 |
| 2013/0187228 A1 | 7/2013 | Xie et al. |
| 2014/0103414 A1* | 4/2014 | Koldiaev .............. H01L 21/845 257/296 |
| 2014/0284727 A1 | 9/2014 | King Liu et al. |
| 2015/0079751 A1 | 3/2015 | Alptekin et al. |
| 2015/0115372 A1 | 4/2015 | Yang et al. |
| 2015/0317420 A1 | 11/2015 | Terterian et al. |
| 2015/0364592 A1* | 12/2015 | van Dal ................ H01L 29/785 257/29 |
| 2016/0172507 A1 | 6/2016 | Annunziata et al. |
| 2016/0359006 A1 | 12/2016 | King Liu et al. |

FOREIGN PATENT DOCUMENTS

| | | |
|---|---|---|
| KR | 20120118566 | 10/2012 |
| KR | 20130101810 A | 9/2013 |
| WO | 2014204477 A1 | 12/2014 |

OTHER PUBLICATIONS

Vellianitis et al., High Crystalline Quality Ge Grown by MOCVD Inside Narrow Shallow Trench Isolatin Defined on Si (001) Substrates, Journal of Crystal Growth 383 (2013) 9-11, 3 pages.

Van Dal et al., "Demonstration of Scaled Ge P-Channel FinFET Integrated on Si,", Electron Devices Meeting (IEDM), 2012 IEEE International, 4 pages.

Hellemans, "Molybdenum Ditelluride: Like 2-D Silicon, But Better," IEEE Spectrum, https://spectrumieee.org/nanoclast/semiconductors/nanotechnology/a-new-prototype-that-may-lead-to-2d-transistor-with-silicon-properties-but-better, Aug. 10, 2015, 3 pages.

Johnson, D., "Graphene Circuit Competes Head-to-Head With Silicon Technology," IEEE Spectrum, https://spectrum.ieee.org/nanoclast/semiconductors/nanotechnology/graphene-circuit-competes-headtohead-with-silcon-technology, Feb. 3, 2014, 2 pages.

Synopsys Datasheet, Sentaurus TCAD, Industry-Standard Process and Device Simulators, Datasheet (2012), 4 pages.

Graphene and Other 2-Dimensional Materials: An Innovative Toolbox Supporting 2D Materials, Oxford Instruments, 2014, 12 pages.

Szabo, et al., "Ab-initio Simulations of MoS 2 Transistors: From Mobility Calculation to Device Performance Evaluation," In Electron Devices Meeting (IEDM), IEEE International (2014), pp. 30-4.1-30.4.4.

Johnson, D., "IBM Demonstrates Graphene Transistor Twice as Fast as Silicon," https://spectrum.ieee.org/nanoclast/semiconductors/nanotechnology/ibm-demonstrates-graphene-transistor-twice-as-fast-as-silicon, IEEE Spectrum, Feb. 8, 2010, 2 pages.

Johnson, R., "IBM Demos 100-GHz Graphene Transistor," https://www.eetimes.com/documentasp?doc_id=1172958&print=yes, EE Times, Feb. 5, 2010, 2 pages).

Quirk et al., Semiconductor Manufacturing Technology, 2001, Prentice Hall, ISBN 0-13-081520-9, pp. 4-7, 390-393.

Bringham Young University, Crystal Planes in Semiconductors, 2010, http://cleanroom.byu.edu/EW.sub.—orientation.phtml, pp. 1-2.

CN 2016-80039906-1—Voluntary Amendments as filed Sep. 28, 2018, 122 pages.

* cited by examiner

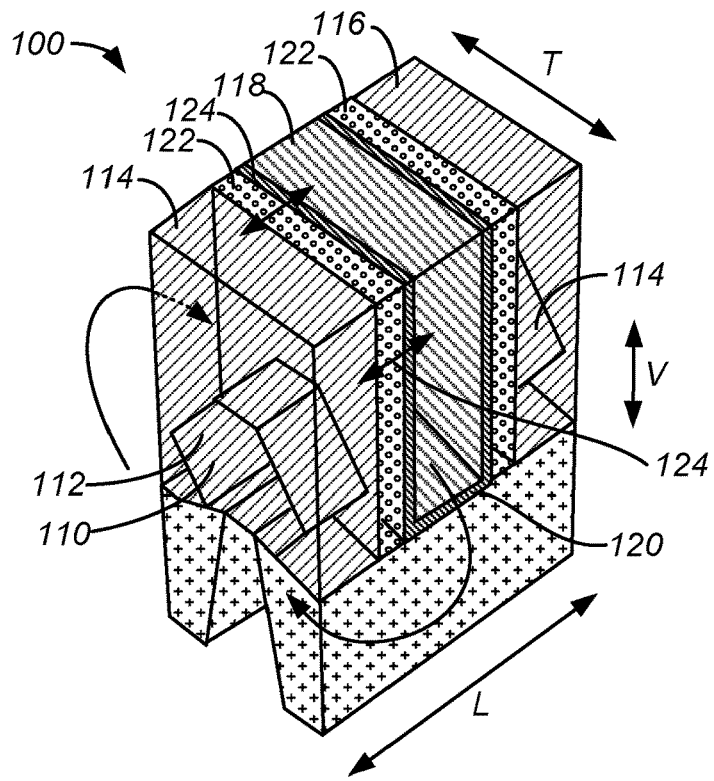
FIG. 1
*(PRIOR ART)*
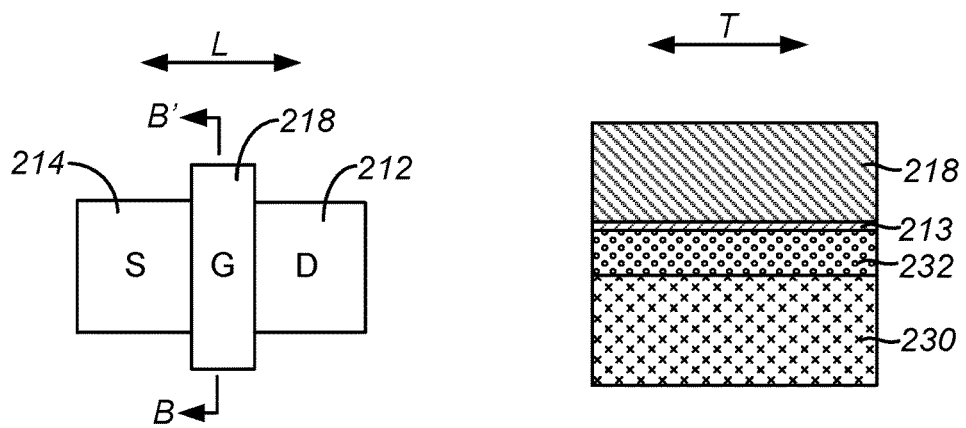
FIG. 2A
*(PRIOR ART)*
FIG. 2B
*(PRIOR ART)*

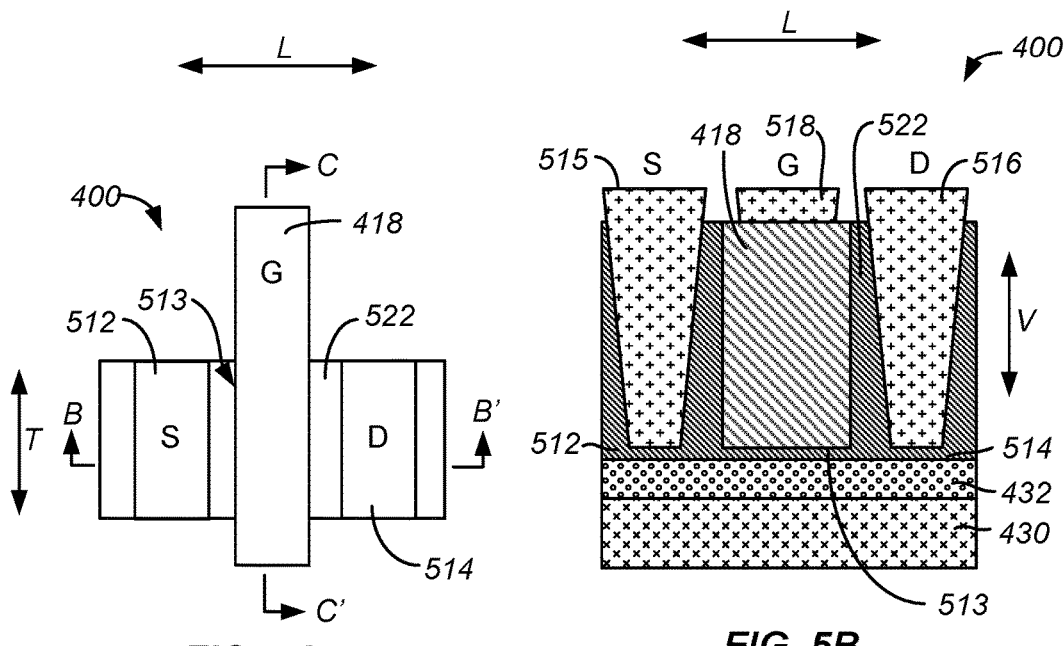
FIG. 5A
FIG. 5B
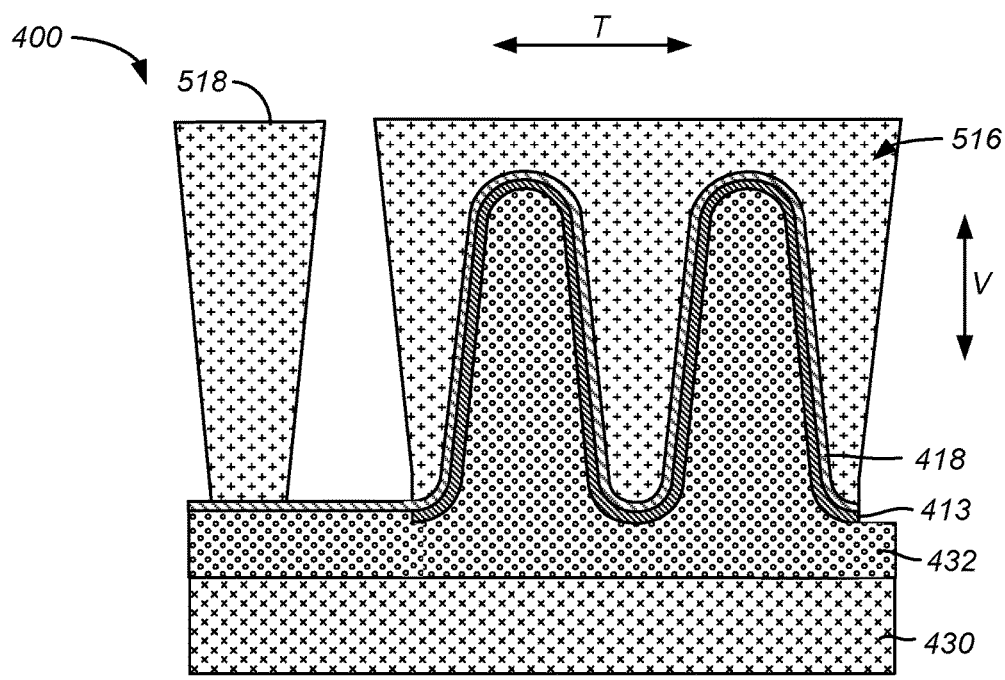
FIG. 5C

SUBSTRATES AND TRANSISTORS WITH 2D MATERIAL CHANNELS ON 3D GEOMETRIES

CROSS-REFERENCE TO OTHER APPLICATIONS

Applicants hereby claim the benefit under 35 U.S.C. 119(e) of U.S. Provisional Application No. 62/172,700, filed 8 Jun. 2015, entitled "Substrates And Transistors With 2D Material Channels On 3D Geometries"; and U.S. Provisional Application No. 62/242,236, filed 15 Oct. 2015, entitled "Substrates And Transistors With 2D Material Channels On 3D Geometries". Both provisional applications are hereby incorporated by reference herein for their teachings.

BACKGROUND

FinFETs can be scaled down to 7 nm design rules and perhaps stretched to 5 nm design rules. Beyond 5 nm design rules, short channel effects degrade FinFET performance such that further scaling does not bring benefits. Some developers are considering Gate-All-Around nanowires, which could enable scaling down to ~2 nm design rules.

FIG. 1 is a simplified perspective view of a conventional FinFET transistor 100. It comprises a semiconductor "fin" 110 extending in a longitudinal direction L. The fin also has a transverse direction T. The fin has drain and source regions 112 and 114 respectively, separated longitudinally by a channel region (hidden in the drawing). Drain and source contacts 116 and 118, respectively, are connected to the drain and source regions 112 and 114, respectively, and are separated longitudinally by a gate stack 118. The gate stack 118 may be a high-K metal gate (HKMG) layer (metal gate sub-layer separated in a vertical direction V from the channel region of the fin by a thin high-K gate dielectric layer 120. The gate stack 118 is separated longitudinally from each of the drain and source terminals 114 and 116 by dielectric spacer material 122.

One limitation on scaling of FinFETs and nanowires is that Middle-Of-Line (MOL) parasitic capacitance is increasing as 1/x with each technology generation, where x is the spacer width (in the transistor longitudinal direction), scaling as 0.7× per generation. MOL capacitance comes mainly from the gate 118 facing the drain contact 114 across the shrinking spacer 122. See the arrows 124 in FIG. 1. MOL capacitance is expected to overtake interconnect capacitance as the dominant load of the transistor at 5 nm design rules, and will continue increasing with further scaling.

Another limitation on scaling of FinFETs is that fin pitch scaling is limited by the multi-layer High-K dielectric+ Metal Gate (HKMG) stack which requires consistent HKMG vertical thickness in order to maintain a consistent threshold voltage. Currently, the minimum HKMG stack thickness between the fins is approximately 14 nm and would require a new technology to shrink beyond that.

Yet another limitation on scaling of FinFETs is cross-sectional fin shape variability. It is difficult to enforce consistent fin shape, and fin shape variations introduce FinFET performance variations. For example, off-state current increases exponentially with increases in fin width. Performance variations lead to lower circuit performance and higher chip area and cost. It seems that new ideas will be needed in order to continue scaling transistors down to smaller and smaller sizes.

SUMMARY

Roughly described, the invention involves wrapping a semiconductor 2D material layer conformally on a 3D structure. The 3D structure can be for example a ridge made of a dielectric material, or made of dielectric material alternating longitudinally with a semiconductive or conductive material. Alternatively the 3D structure can be tree-shaped. Other shapes are possible as well. Aspects of the invention also include methods for making such structures, as well as integrated circuit layouts defining such structures and methods for developing such layouts, a machine readable data storage medium storing design entries which include some which define such structures and layouts, methods for developing such design entries. Aspects of the invention further include corrugated wafers which are prepared as an intermediate product for use in fabricating integrated circuits having a semiconductor 2D material layer disposed conformally on a 3D structure.

Some developers are considering making transistors using a 2D material like graphene or MoS2 as a channel. FIG. 2A is a top view of such a transistor, and FIG. 2B is a cross-sectional view taken along arrows B-B' in FIG. 2A. The transistor has a 2D material layer 213 overlying an oxide layer 232 which itself overlies a silicon substrate 230. An HKMG stack 218 overlies the 2D material layer 213 at the longitudinal position of the channel. It can be seen that the transistor of FIGS. 2A and 2B is planar. Transistors made this way could enable scaling beyond 2 nm design rules, but unfortunately they lack the drive strength required to send signals through interconnects.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which:

FIG. 1 is a simplified perspective view of a conventional FinFET transistor 100.

FIG. 2A is a top view of a proposed transistor, and FIG. 2B is a cross-sectional view of the proposed transistor taken along arrows B-B' in FIG. 2A.

FIGS. 5A, 5B, 5C and 5D, (collectively FIG. 5) are multiple views of the transistor of FIG. 4.

FIG. 11A, FIG. 11B, FIG. 11C, FIG. 11D, FIG. 11E, FIG. 11F, FIG. 11G, FIG. 11H, FIG. 11I, FIG. 11J, FIG. 11K, FIG. 11L, and FIG. 11M, (collectively FIG. 11) illustrates a method for fabricating tree-shaped transistors according to an aspect of the invention. FIGS. 11A through 11H show the structure in cross-sectional view, and FIGS. 11I through 11L show the structure in side elevational view. FIG. 11M shows the structure in top view.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 3:
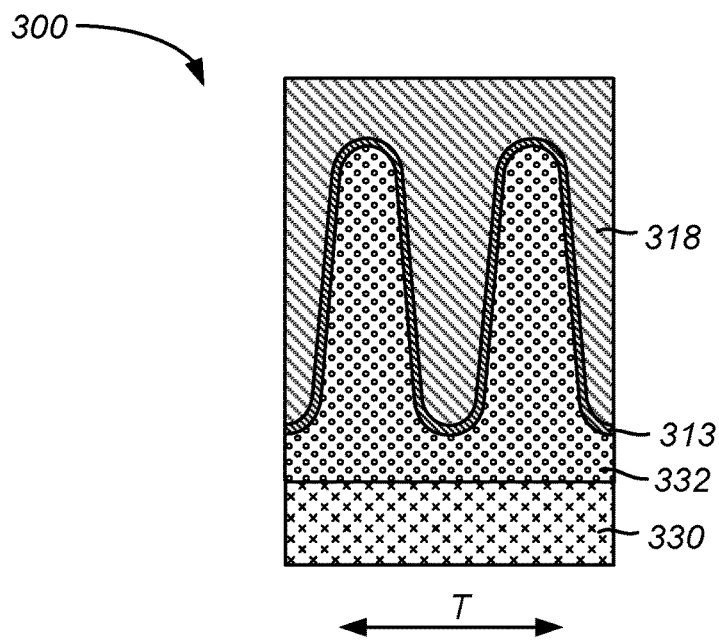
FIGS. 3, 4, 6 and 7 are cross-sectional views of transistors incorporating aspects of the invention.

As mentioned, an embodiment of the invention involves disposing at least one 2D material layer conformally on the surface of a 3D structure. As used herein, a 3D structure is one that has at least two non-coplanar surfaces. The 3D structure can be for example a ridge, which is considered herein to have at least three non-coplanar surfaces disposed transversely from one another on the body: the top and the two sidewalls. While any shape 3D structure can be used, ridges such as those used to make FinFETs are advantageous because it is already known how to make ridges with large aspect ratios. FIG. 3 illustrates a cross-sectional view of a transistor 300 having two ridges 332 and incorporating this concept. The ridges are made of a dielectric material such as an oxide, and are supported by a substrate 330 which may be silicon, but could be any rigid material. The ridges have a longitudinal dimension into and out of the page, and a transverse direction T. The structure has multiple non-coplanar surfaces disposed transversely from one another, including the two sidewalls of each of the ridges 332, the tops or peaks of each of the ridges, and the troughs or valleys between them. A 2D material layer 313 is disposed "conformally" on the ridges 332, so as to overlie all of the transversely disposed non-coplanar surfaces. The more of these surfaces covered, the greater the effective width of the transistor channel, and the greater the resulting transistor drive strength. In addition, an HKMG stack 318 overlies the semiconductor 2D material layer 313 at the longitudinal position of the channel. Though FIG. 3 shows a single element labeled "HKMG", it will be appreciated that HKMG represents a stack of materials, typically a thin layer of high-K dielectric vertically adjacent to the semiconductor 2D material layer, and a much thicker metal layer superposing the high-K dielectric layer.

As used herein, a particular layer disposed "conformally" on a body does not necessarily require that the particular layer touch the body; it is sufficient that it is disposed conformally on another layer which is itself disposed conformally on the body and whose outer surface, adjacent to the particular layer, itself has a contour that generally follows the contour of the body. Also, as used herein, the term "conformal" refers to the interface between the particular layer and the underlying body. The outer surface of the particular layer can have a different contour than that of the body, and the particular layer can still be considered herein to be disposed "conformally" on the body. Additionally, a conformal layer disposed so as to "overlie" or "underlie" a subject surface does not necessarily mean that the conformal layer must be located vertically above or below the subject surface. As used herein, a particular surface "overlies" a subject surface if it is perpendicularly farther away from the underlying body than is the subject surface, and the particular surface "underlies" the subject surface if it is perpendicularly nearer to the underlying body than is the subject surface. For a tree branch structure, for example, a conformal layer disposed so as to "overlie" an undersurface of one of the branches is actually located below the undersurface of the branch, as the terms are used herein.

Roughly speaking, if the aspect ratio of the ridges 332 is AR, then a semiconductor 2D material layer deposited conformally on the peaks, valleys and sidewalls of the ridges 332 would have a channel width on the order of AR+1 times the width of a planar channel covering the same transverse footprint. Drive strength is roughly proportional to channel width, so drive strength, too, increases roughly by a factor of AR+1. As aspect ratios for FinFETs today are as high as approximately 10:1, this technique can result in an increase in transistor drive strength roughly by a factor of 10.

A "2D material layer", as used herein, is layer that includes or consists essentially of one or more sub-layers of doped or undoped "2D material". A "2D material", as used herein, is a material that, within each sub-layer, tends to form strong bonds such as covalent bonds, whereas between sub-layers, tends to form relatively weaker bonds such as Van der Waals bonds. Electrons in each sub-layer of these materials are free to move in the two-dimensional plane, but their motion in the third dimension is restricted and governed by quantum mechanics. Graphene is an example of a "2D material" in which each sub-layer has a thickness of only a single atom. Molybdenum disulfide (MoS2) is an example of a "2D material" in which each sub-layer has three internal monolayers: a middle monolayer of Mo, sandwiched between upper and lower monolayers of S. The bonds between the Mo atoms and the S atoms are covalent, whereas bonds between the lower S monolayers of one layer and the upper S monolayers of the layer below it are Van der Walls bonds. Other examples of "2D materials" include tungsten diselenide (WSe2), niobium diselenide (NbSe2), boron nitride (BN), tungsten sulfide (WS2), phosphorene (PR3), stanananene (Sn), and the transition metal di-chalcogenides.

A 2D material layer typically has a thickness of under one nanometer. In some embodiments the 2D material layer includes more than one sub-layer of 2D material, which can also increase drive current. However, the thicker total material layer can degrade the ability of the gate voltage to control the current flow through the channel, especially at lower sub-layers of 2D material. Also, the use of more than one sub-layer can in some embodiments change the band structure. Where more than one sub-layer is used, not all the sub-layers need necessarily be of the same 2D material in all embodiments.

For some 2D materials, such as graphene, semiconductor properties arise only if the width of the current-carrying path (i.e. the width of the channel) is sufficiently small. If forming such a 2D material conformally on a 3D support structure widens the channel too much, then in an embodiment, the 2D material can be cut longitudinally into more than one segment transversely across the channel. For example, in the FIG. 3 example above, the semiconductor 2D material layer can be removed from the tops of the ridges for example by CMP. The semiconductor 2D material layer is still considered to overlie at least two non-coplanar surfaces of each ridge 332, since it still overlies both sidewalls. The device also still acts as a single transistor if the multiple transversely separated segments are connected together by a single source region (e.g. in front of the page) and a single drain region (e.g. behind the page).

The ridge material in FIG. 3 may be oxide, or any other dielectric material. The substrate 330 is present only for physical support, so it can be silicon or any other appropriate material. Also, the channel width is defined by cutting the semiconductor 2D material layer at the desired transverse edges of the channel. In one embodiment the cut extends only down through the semiconductor 2D material layer, and the oxide remains intact. In another embodiment the oxide is cut as well, for example down to the support wafer 330.

The above FIG. 3 solution improves scaling because it improves transistor drive strength sufficiently to enable practical use of semiconductor 2D materials as channel materials. Since the semiconductor 2D material layer is so thin, the gate voltage is able to control current flow through the channel extremely well. As a result, the gate length (in the dimension into and out of the page) can be made shorter.

The above FIG. 3 solution also obviates the fin width variability problem described above, because current flows through the 2D channel material layer rather than through the body of the fin. Since the HKMG layer 318 is deposited conformally over the semiconductor 2D material layer 313, any variations in the thickness of the ridges 332 are repeated at the interface to the HKMG, resulting in a channel thickness that remains constant. Thus variations in the shape of the ridges 332 make virtually no difference in transistor performance.

Figure 4:
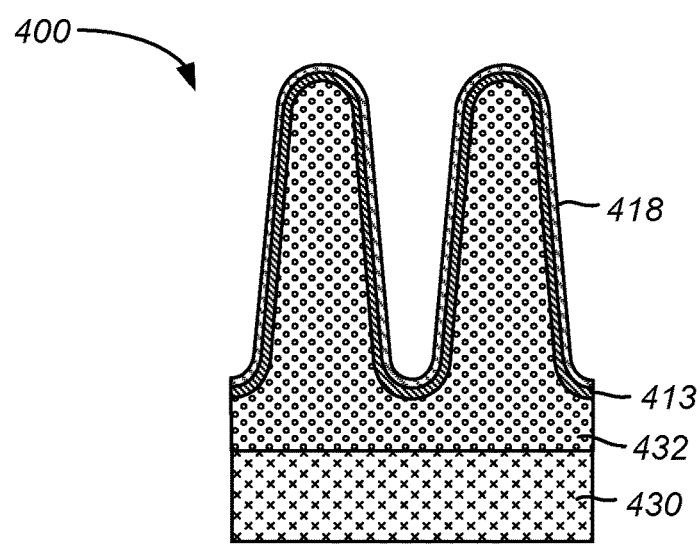

The above FIG. 3 solution, as drawn, does not necessarily solve the MOL capacitance problem described above, because the HKMG is still separated from the drain contact by only a small spacer (similar to 122 in FIG. 1) which as mentioned, is shrinking with each technology node. It also does not necessarily solve the fin pitch problem described above, because as drawn, the HKMG stack thickness has not changed. However, these problems can be solved as well by also replacing the metal gate sub-layer of the HKMG stack with a 2D material layer, as shown in FIG. 4. FIG. 4 illustrates a cross-sectional view of a transistor 400 having two ridges 432 and incorporating this concept. As with the FIG. 3 embodiment, the ridges 432 in FIG. 4 are made of a dielectric material such as an oxide, and are supported by a substrate 430 which may be silicon, but could be any rigid material. Again, the structure has multiple non-coplanar surfaces disposed transversely from one another. A semiconductor 2D material layer 413 is disposed conformally on the ridges 432, so as to overlie all of the transversely disposed non-coplanar surfaces. In addition, a gate stack 418 is disposed conformally on the ridges 432 so as to overlie the ridges 432. Though not shown separately in FIG. 4, the gate stack 418 is a dielectric layer disposed conformally on the ridges 432 so as to overlie at least part of the semiconductor 2D material layer 413, and a gate conductor, which is preferably a conductive 2D material layer such as graphene, disposed conformally on the protrusions so as to overlie at least part of the dielectric layer.

This FIG. 4 embodiment overcomes the fin shape variability problem and the drive strength problem discussed above, and additionally it overcomes the MOL capacitance problem because the cross-sectional area of the gate conductor, facing the drain contact across the shrinking spacer, is now miniscule. The gate contact itself can be disposed out-of-line with the source and drain contacts (e.g. at the right hand edge of the FIG. 4 drawing), so as to also minimize capacitance between the gate contact and the drain contact.

This FIG. 4 embodiment also overcomes the fin pitch problem described above, because a thick HKMG stack is no longer necessary. The fin-to-fin spacing of a MOSFET-type transistor as shown in FIG. 4, with current flowing longitudinally along the semiconductor 2D material layer 413 into or out of the page, need only be large enough to accommodate the thicknesses of two semiconductor 2D material layer channels, two high-K dielectric layers, two conductive 2D gate material layers, plus one air gap (the minimum spacing needed between the rising and falling semiconductor 2D material layers in order to ensure consistent thickness and structure). Assuming each 2D material layer has a thickness of approximately 0.6 nm, and each high-K dielectric layer has a thickness of approximately 2 nm, and the air gap is approximately 2 nm wide, this results in a fin-to-fin spacing of no more than 8.4 nm. Adding the thickness of one uncoated ridge 432, which today can be made reliably at 10 nm, this means that transistors made according to the FIG. 4 embodiment can be made on fins having a pitch no greater than 18.4 nm.

The conductive 2D material layer that forms the gate conductor can be of the same or different material(s) than the channel material(s). For example, whereas the 2D material layer chosen for the channel material may be a native semiconductor, the 2D material chosen for the gate conductor may be a native conductor such as graphene. Also, like the semiconductor 2D material layer, the conductive 2D gate conductor material layer may comprise more than one 2D material sub-layer, and such sub-layers might include more than one material type.

The dielectric layer of the gate stack can be made from a 2D material that is an insulator, rather than a high-K dielectric, but doing so would not necessarily provide any further reduction in the thickness of the gate stack, since a dielectric thickness of at least around 2 nm is still needed in order to prevent charge leakage across the dielectric.

Figure 5D:
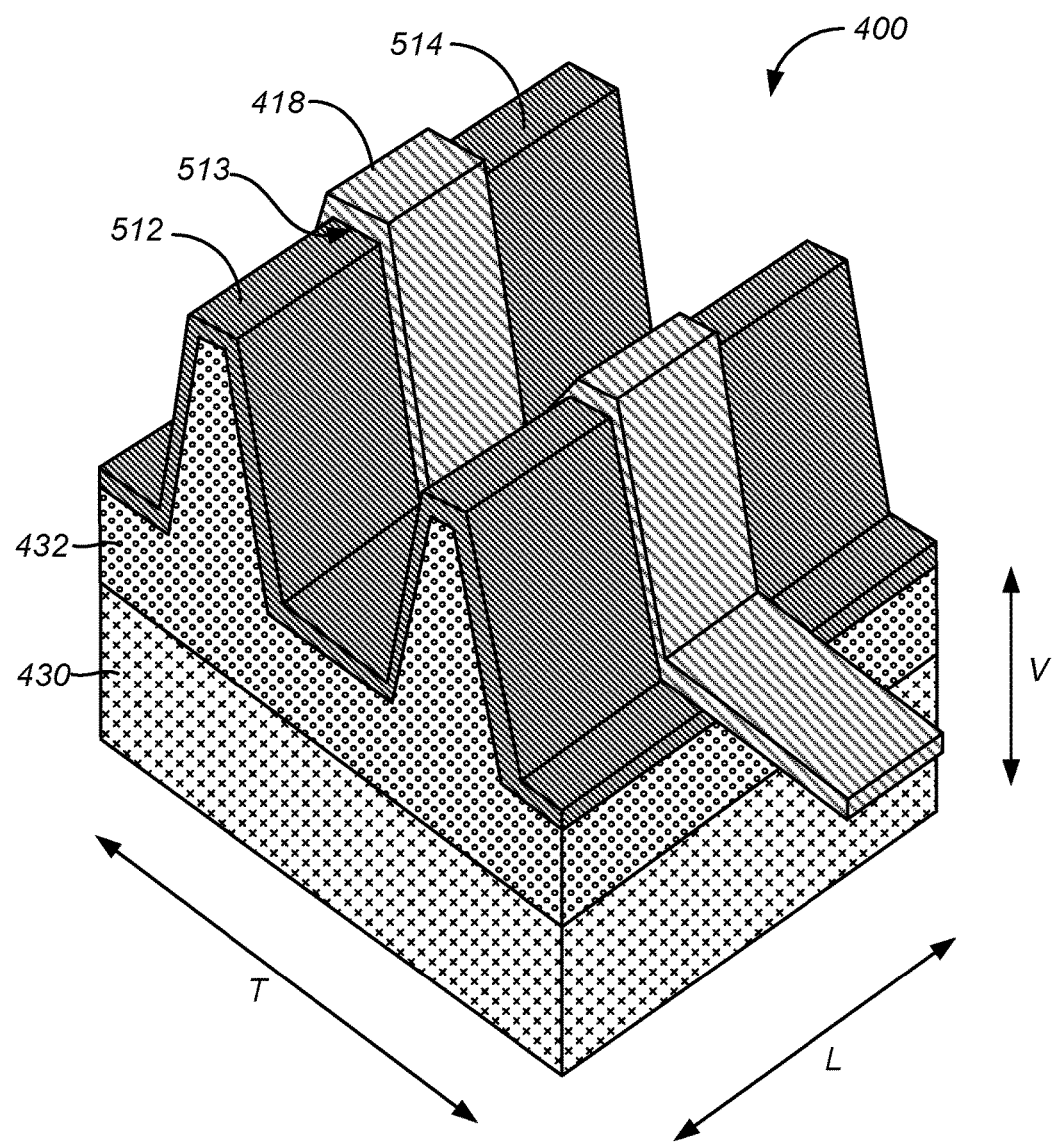

FIG. 5, consisting of FIGS. 5A, 5B, 5C and 5D, are multiple views of the transistor of FIG. 4. FIG. 5A is a top view, FIG. 5B is a side elevation view taken along sight lines B-B' (ridges are oriented left-right), FIG. 5C is a side elevation view taken along sight lines C-C' (ridges are oriented into the page), and FIG. 5D is a 3D perspective view. FIG. 5B shows the drain, source and gate terminals and FIG. 5C shows the drain and gate terminals. FIGS. 5A and 5D omit the drain, source and gate terminals for clarity of illustration. In either the FIG. 3 embodiment or the FIG. 4/5 embodiment, the appropriate charge carriers can be installed in the source and drain regions of the 2D material on longitudinally opposite sides of the channel either by doping with an appropriate dopant, or by adding an appropriate further 2D material layer adjacent to (above or below) the 2D channel material layer in those regions.

FIG. 5 illustrates the two ridges 432 of the transistor 400, supported by the substrate 430. The semiconductor 2D material layer is designated 413 in FIG. 4, since only the channel region of the semiconductor 2D material layer is depicted in FIG. 4. In FIG. 5 the drain, source and channel regions 514, 512 and 513 of the semiconductor 2D material layer are shown in various views. Also the gate stack 418 is shown, as are the drain, source and gate terminals 516, 515 and 518, respectively. It can be seen from the figures that the gate terminal 518 is offset transversely from a line joining the drain and source terminals 516 and 515.

Figure 6:
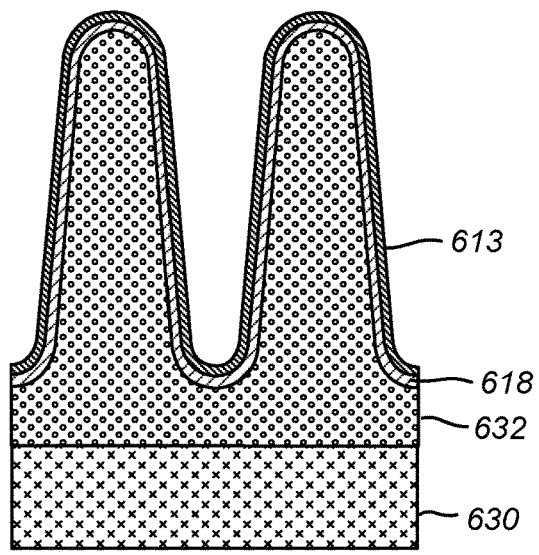

Another solution for the problems of scaling and fin pitch is to form a Tunneling FET (TFET) instead of a MOSFET-type transistor. In a MOSFET-type transistor the current flows longitudinally along the semiconductor 2D material layer sheet. In a TFET-type transistor current flows across the 2D materials, as shown in FIG. 6. TFETs switch by modulating quantum tunneling through a barrier instead of modulating thermionic emission over a barrier as in traditional MOSFETs. Thus in FIG. 6, the source and drain portions of the 2D material layer are located in front of and behind the page, respectively, but one is made p-type and the other is made n-type. The channel portion of the 2D material, which is the portion controlled by the gate layer, can be neutral or intrinsic.

In FIG. 6, the stack of two 2D material layers includes is covered by HKMG. The minimum fin-to-fin spacing is the thickness of four layers of 2D material, plus the air gap, which can be as small as 4.4 nm. Adding the thickness of one uncoated fin, this means that TFET transistors made according to the FIG. 6 embodiment can be made on fins having a pitch no greater than 14.4 nm.

Figure 7:
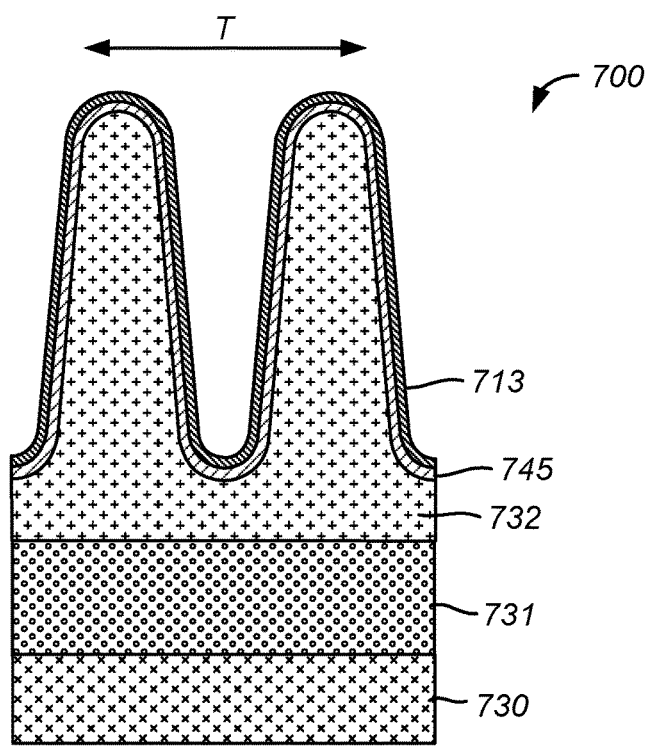

Another solution to all the problems described above is similar to that of FIGS. 4 and 5, except that the gate conductor underlies the semiconductor 2D material layer rather than overlying it. That is, the ridges can be formed such that they are dielectric material below the drain and source regions of the semiconductor 2D material layer, and a conductive material such as a metal below the channel region of the semiconductor 2D material layer. A ridge formed for supporting multiple transistors longitudinally along the ridge therefore can have longitudinally alternating dielectric and metal volumes. Formed conformally on the ridges (at least above the metal gate volumes) is the high-K dielectric, and the semiconductor 2D material layer is formed conformally on the dielectric. Thus FIG. 7 illustrates a cross-sectional view of a transistor 700 having two ridges 732 which, below the semiconductor 2D material layer, are made of metal. The ridges 732 are supported by an oxide layer 731 which overlies a substrate 730 which may be silicon, but could be any rigid material. Again, the structure has multiple non-coplanar surfaces disposed transversely from one another. A semiconductor 2D material layer 713 is disposed conformally on the ridges 732, so as to overlie all of the transversely disposed non-coplanar surfaces. In addition, at least over the metal gate volume of ridges 732, the semiconductor 2D material layer 713 is separated from the ridges 732 by a high-K gate dielectric 745.

The fin-to-fin spacing of a MOSFET-type transistor as shown in FIG. 7 can be as narrow as the thicknesses of two 2D-material layer channels, two high-K dielectric layers, plus one air gap, resulting in a fin-to-fin spacing which can be as narrow as only 7.2 nm. Adding the thickness of one uncoated fin, this means that transistors made according to the FIG. 7 embodiment can be made on fins having a pitch no greater than 17.2 nm.

The metal gate volume of ridges 732 in the embodiment of FIG. 7 are metal, but in another embodiment they could be polysilicon or doped semiconductor, such as doped silicon. The doping in the semiconductor gate can be used to alter the silicon workfunction throughout a wide range, and it can be enough to establish whether the transistor channel is to be N-type or P-type. CMOS circuits therefore can be achieved by pre-doping the semiconductor ridges so as to define some regions for N-type transistors and other regions for P-type transistors. Also, though the dielectric layer is indicated in FIG. 7 as being of a high-K material, in another embodiment it is a low-k dielectric material in order to help reduce the fringing gate-to-drain coupling.

As with the FIG. 4/5 embodiment, in the FIG. 7 embodiment the appropriate charge carriers can be installed in the source and drain regions of the 2D material on longitudinally opposite sides of the channel either by doping with an appropriate dopant, or by adding an appropriate further 2D material layer adjacent to (above or below) the semiconductor 2D material layer in those regions.

As with the FIG. 4/5 embodiment above, this FIG. 7 solution overcomes the fin shape variability problem, the drive strength problem, the MOL capacitance problem, and the fin pitch problem, all for the same reasons as discussed above.

Figure 8A:
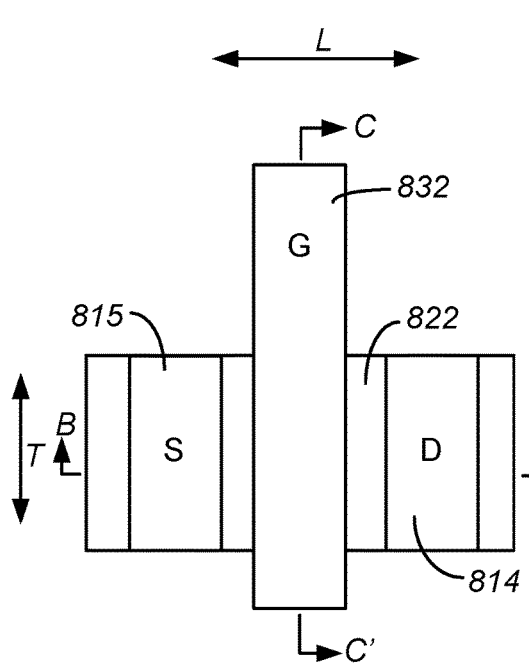
FIG. 8, consisting of FIGS. 8A, 8B and 8C, are multiple views of the transistor of FIG. 7.
Figure 8B:
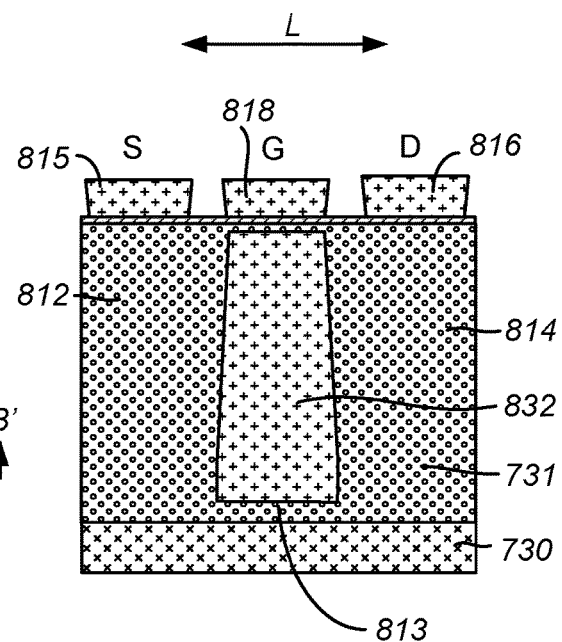
Figure 8C:
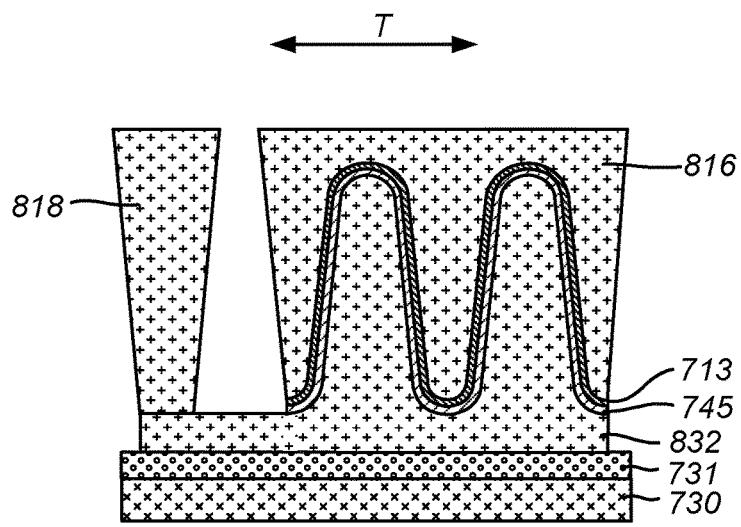

FIG. 8, consisting of FIGS. 8A, 8B and 8C, are multiple views of the transistor of FIG. 7. FIG. 8A is a top view, FIG. 8B is a side elevation view taken along sight lines B-B' (ridges are oriented left-right), FIG. 8C is a side elevation view taken along sight lines C-C' (ridges are oriented into the page). FIG. 9B is a perspective view. FIG. 8B shows the drain, source and gate terminals and FIG. 8C shows the drain and gate terminals. FIGS. 8A and 9B omit the drain, source and gate terminals for clarity of illustration. Again, the appropriate charge carriers can be installed in the source and drain regions of the semiconductor 2D material layer on longitudinally opposite sides of the channel either by doping with an appropriate dopant, or by adding an appropriate further 2D material layer adjacent to (above or below) the semiconductor 2D material layer in those regions.

FIG. 8 illustrates the two ridges 732 of the transistor 700, with the volume segments 833, 835 and 832 underlying the drain, source and channel regions 814, 812 and 813, respectively, of the semiconductor 2D material layer. The volume segment 832 under the channel region is metal, whereas the volume segments 833 and 835 under the drain and source regions are oxide. The ridges are supported by the substrate 730. In FIG. 8B the drain, source and gate terminals 816, 815 and 818 are shown, and in FIG. 8C the drain and gate terminals 816 and 818 are shown. It can be seen from the figures that the gate terminal 818 is offset transversely from a line joining the drain and source terminals 816 and 815.

Corrugated Substrate

Each of the embodiments above can be fabricated by first fabricating a corrugated substrate, and then modifying it as needed to form the individual transistors. Corrugated substrates are described in King U.S. Pat. No. 7,190,050, incorporated herein by reference. The drawings in the King patent show how the structure would appear, in various embodiments. The corrugated substrate, at any of the stages of completion, can itself be packaged and sold as an intermediate product.

Figure 18:
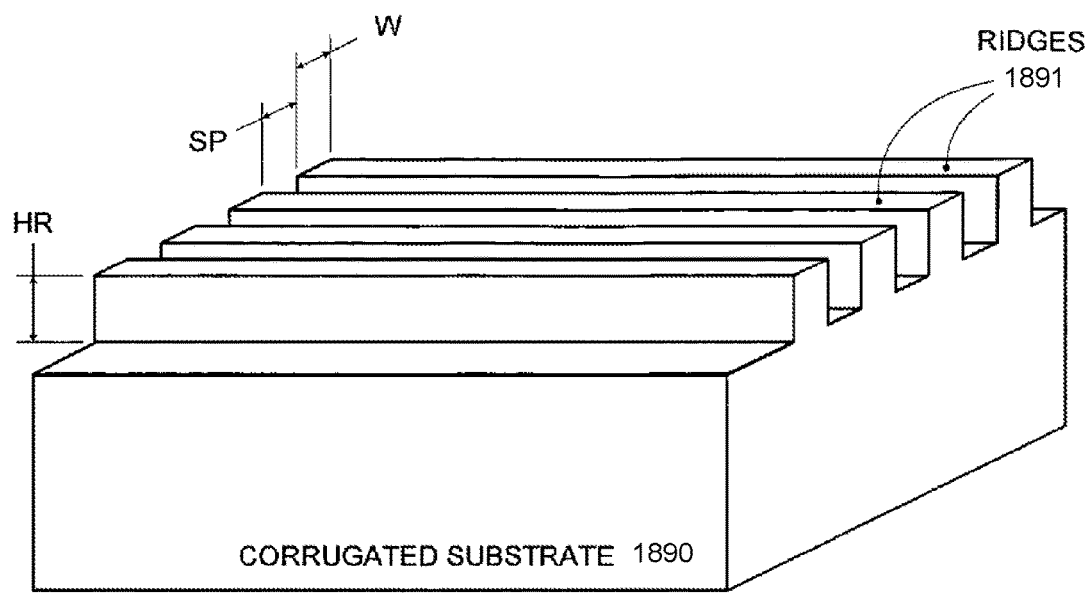
FIGS. 18, 19A, 19B, 19C, 19D and 20 illustrate various aspects of corrugated substrates incorporating aspects of the invention.

FIG. 18 shows an example corrugated substrate 1890 that includes a set of ridges 1891. Note that as used herein, no distinction is intended between the terms "in" and "on" a substrate or wafer, so that the ridges 1891 are referred to equally herein as being "in" or "on" the substrate 1890. In a FinFET embodiment, the ridges 1891 may have a cross-section similar to the cross-section of the body material of FIG. 4, for example. The ridges 1891 can have other cross-sectional shapes, however, as discussed elsewhere herein. The rectangular cross-sectional ridge shape in FIG. 18 therefore should be seen as only symbolic. Each of ridges

1891 has a height HR, a width W, and a spacing between ridges SP. Because ridges 1891 are made prior to any specific device patterning, various processing techniques can be used to generate ridges 1891 with a high degree of accuracy and regularity. For example, imprint lithography is a technique in which a master stencil is precisely patterned using electron-beam lithography. The master stencil is then used to pattern wafers (e.g., by imprinting a resist pattern onto a wafer), thereby enabling the formation of precise, sub-wavelength features on those wafers. Due to the complexity of most IC layouts, imprint lithography is generally not practical for use on production wafers. However, the technique is ideal for creating regular, repeating patterns on a wafer, such as ridges 1891. The use of imprint lithography can allow ridges 1891 to be created with extremely precise and regular dimensions, thereby avoiding the inherent inaccuracies associated with optical lithography. Other techniques for forming ridges 1891 (such as spacer lithography described in Y.-K. Choi et al., "A spacer patterning technology for nanoscale CMOS," IEEE Transactions on Electron Devices, Vol. 49, No. 3, pp. 436 441, 2002, incorporated by reference herein, in which vertical thin films are created along the sidewalls of sacrificial features, which are subsequently etched away) will be readily apparent.

While ridges 1891 are described herein as being formed from the same material as the underlying bulk substrate for example purposes, according to various other embodiments of the invention, ridges 1891 can comprise a different material. For example, if the ridges are formed of one dielectric material, the underlying bulk material can be a different dielectric material. If the ridges have longitudinal segments formed of one metal or semiconductor material, the underlying bulk material can be a different metal or semiconductor material. Also, the wafer material (silicon in FIGS. 3, 4, 5 and 6; and oxide over silicon in FIGS. 7, 8 and 9) is not shown in FIG. 18.

Figure 19A:
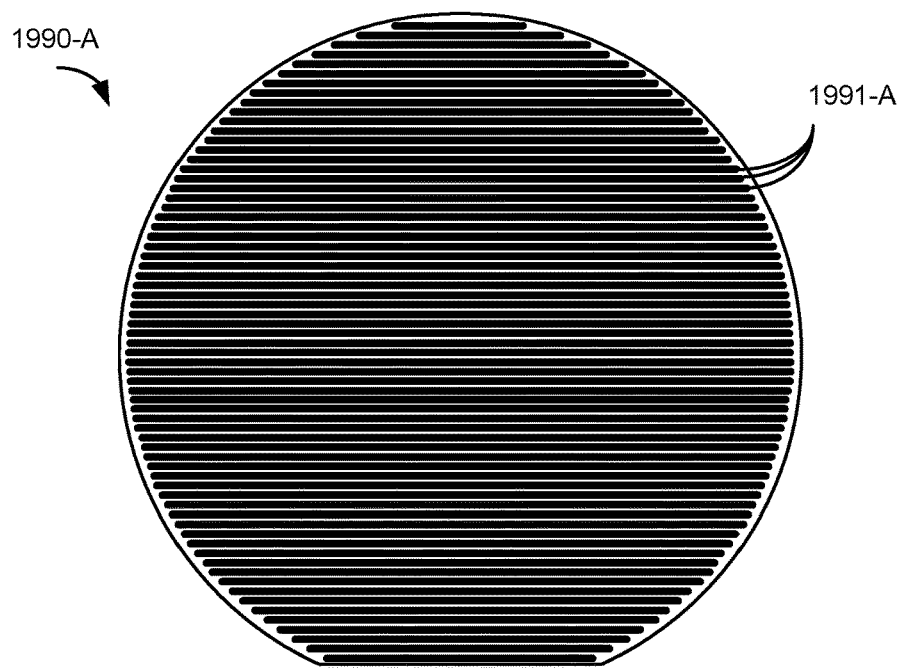

Ridges 1891 can be formed as standalone structures prior to discrete device definition. In one embodiment, a semiconductor wafer can be fully patterned with such ridges, thereby allowing subsequent formation of transistor(s) according to aspects of the invention, at any desired location on the wafer. For example, FIG. 19A shows a top view of a wafer 1990-A that includes an array of ridges 1991-A running across almost the entire wafer surface. Ridges 1991-A have a predetermined height HR, width W, spacing SP, and composition (e.g., dielectric, metal, semiconductor, silicon, silicon-germanium, silicon on silicon-germanium, or carbon nanotubes, among others). By forming ridges at the wafer level, IC production costs are minimally impacted, since this type of simple bulk patterning is much less complex (and therefore much less expensive) than the localized feature formation performed during subsequent IC processing.

Figure 19B:
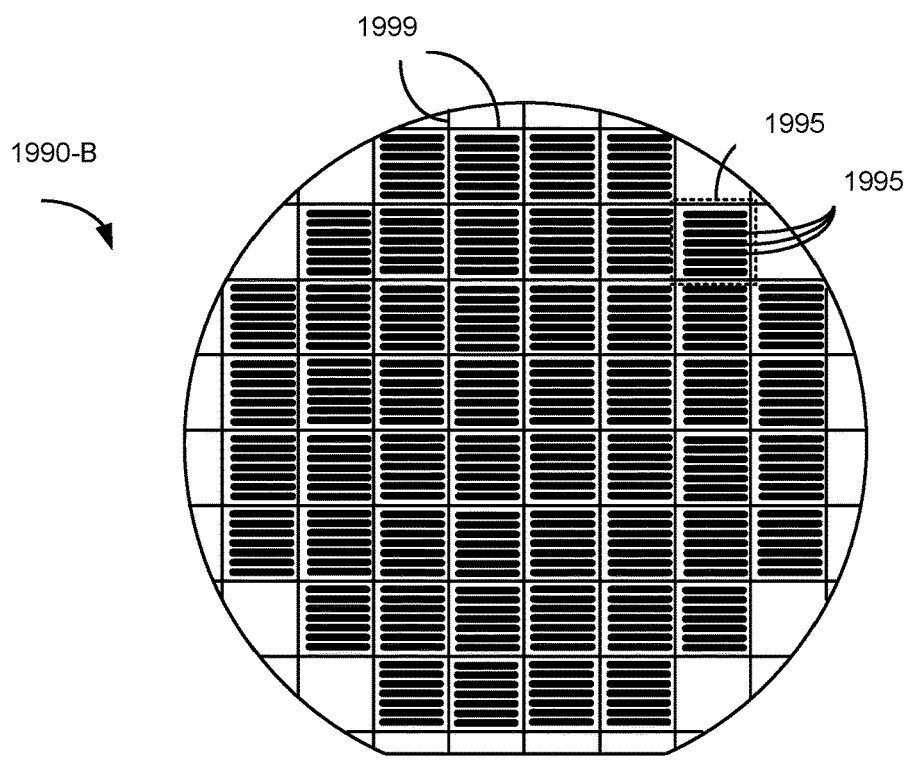

In various other embodiments, a corrugated substrate can include localized groupings of parallel ridges, rather than the continuous ridges 1991-A that span the entire wafer surface as shown in FIG. 19A. For example, FIG. 19B shows another embodiment of a corrugated substrate 1990-B that includes localized ridge sets 1995. Each localized ridge set includes ridges 1991-B that exhibit the same dimensional and physical consistency as described with respect to ridges 1991-A shown in FIG. 19A, but are discontinuous across scribe lines 1999, which can simplify subsequent IC formation and wafer dicing operations. Therefore, each die location on corrugated substrate 1990-B (i.e., each location where an IC is to be formed) includes a separate ridge set 1995. In some embodiments, within each ridge set 1995, localized groupings of ridges 1991-B may exhibit different material compositions (as described in greater detail below with respect to FIG. 20).

Figure 19C:
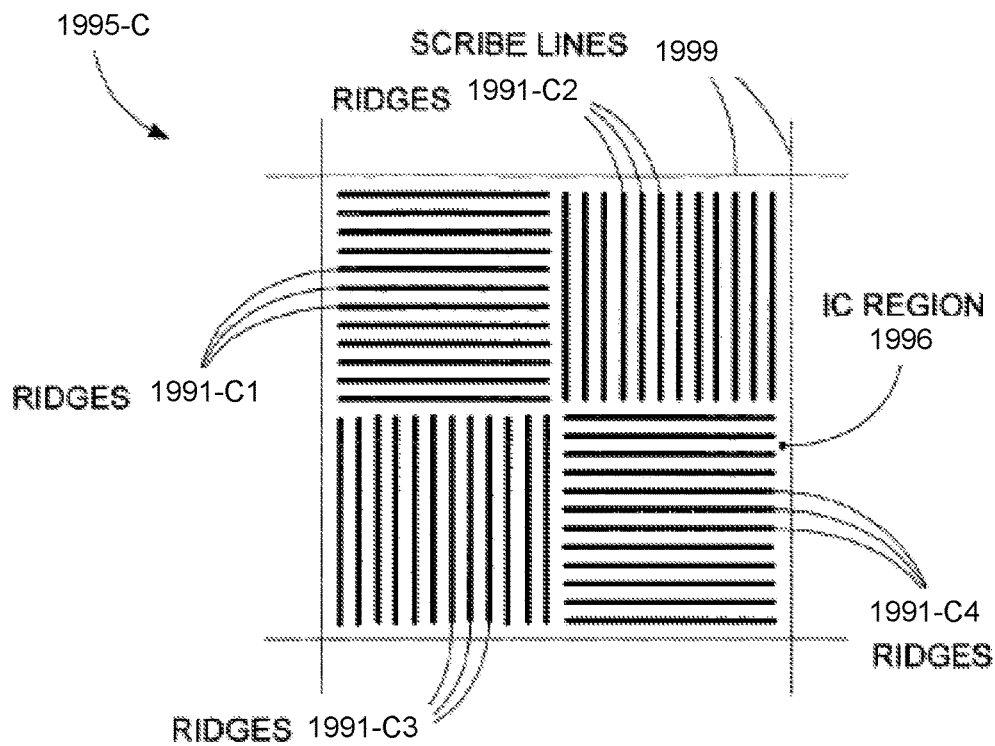

While ridges 1991-B are all shown in FIGS. 19A and 19B as running in the same direction, according to various other embodiments, a corrugated substrate can include multiple localized ridge sets, wherein the ridges in different sets run in different directions. For example, FIG. 19C shows a top view of an alternative localized ridge set 1995-C that could be implemented in place of localized ridge sets 1995 in FIG. 19B. Localized ridge set 1995-C includes a ridge set including parallel ridges 1991-C1, a ridge set including parallel ridges 1991-C2, a ridge set including parallel ridges 1991-C3, and a ridge set including parallel ridges 1991-C4. Parallel ridges 1991-C1 and 1991-C4 run perpendicular to parallel ridges 1991-C2 and 1991-C3. Any other arrangement of ridges can provide the benefits described above, so long as the ridges in any particular set of parallel ridges are longer than the critical dimension (i.e., the minimum geometry) of the devices being formed using the ridges. Note, however, that the ridges themselves may actually be thinner than the critical dimension (since the ridges can be manufactured using techniques other than those ordinarily used in actual device production, as described above). While the areas occupied by parallel ridges 1991-C1, 1991-C2, 1991-C3, and 1991-C4 are depicted as being roughly equal for explanatory purposes, the different ridge groupings within a die location (i.e., between scribe lines) can exhibit any desired sizing relationship with one another.

Figure 19D:
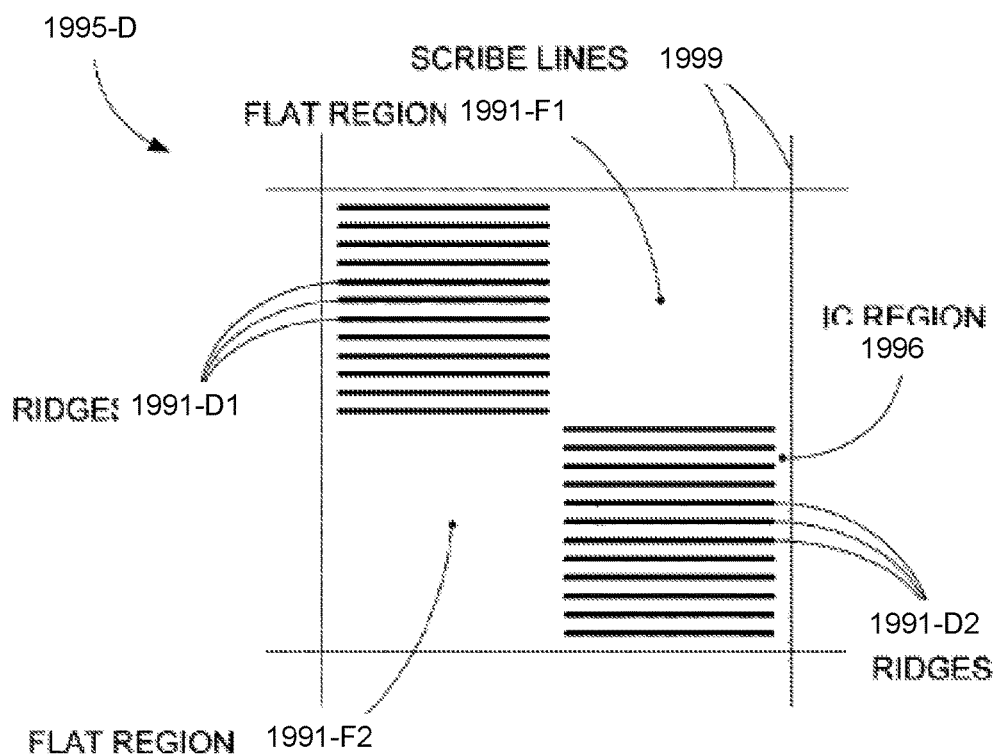

A corrugated substrate can include large planar semiconductor surface regions. For example, FIG. 19D shows a top view of an alternative localized ridge set 1995-D that could be implemented in place of localized ridge sets 1995 in FIG. 19B. Localized ridge set 1995-D includes a ridge set including parallel ridges 1991-D1, a ridge set including parallel ridges 1991-D2, and planar (unridged) semiconductor surface regions 1991-F1 and 1991-F2. Conventional planar semiconductor devices (i.e., transistors, resistors, and/or capacitors) can be formed in these planar semiconductor surface regions 1991-F1 and 1991-F2 simultaneously with corrugated-semiconductor devices, e.g. by using the fabrication process flow described elsewhere herein. Note that while planar semiconductor surface regions 1991-F1 and 1991-F2 are depicted as covering roughly the same area as parallel ridges 1991-D1 and 1991-D2 for explanatory purposes, groupings of parallel ridges and planar regions can exhibit any relative sizing. A portion of a corrugated substrate can be considered a planar region so long as that portion provides an unridged area that is at least as wide as two ridges plus the spacing between those two ridges.

Ideally, a corrugated substrate includes sets of parallel ridges that cover an area at least as large as a basic functional block (e.g., a set of devices that performs a particular logic function). A corrugated substrate providing ridge sets sized in this manner can beneficially minimize the need for additional interconnect wiring between devices within functional blocks. Larger ridge sets can likewise minimize interconnect wiring requirements between functional blocks.

Figure 20:
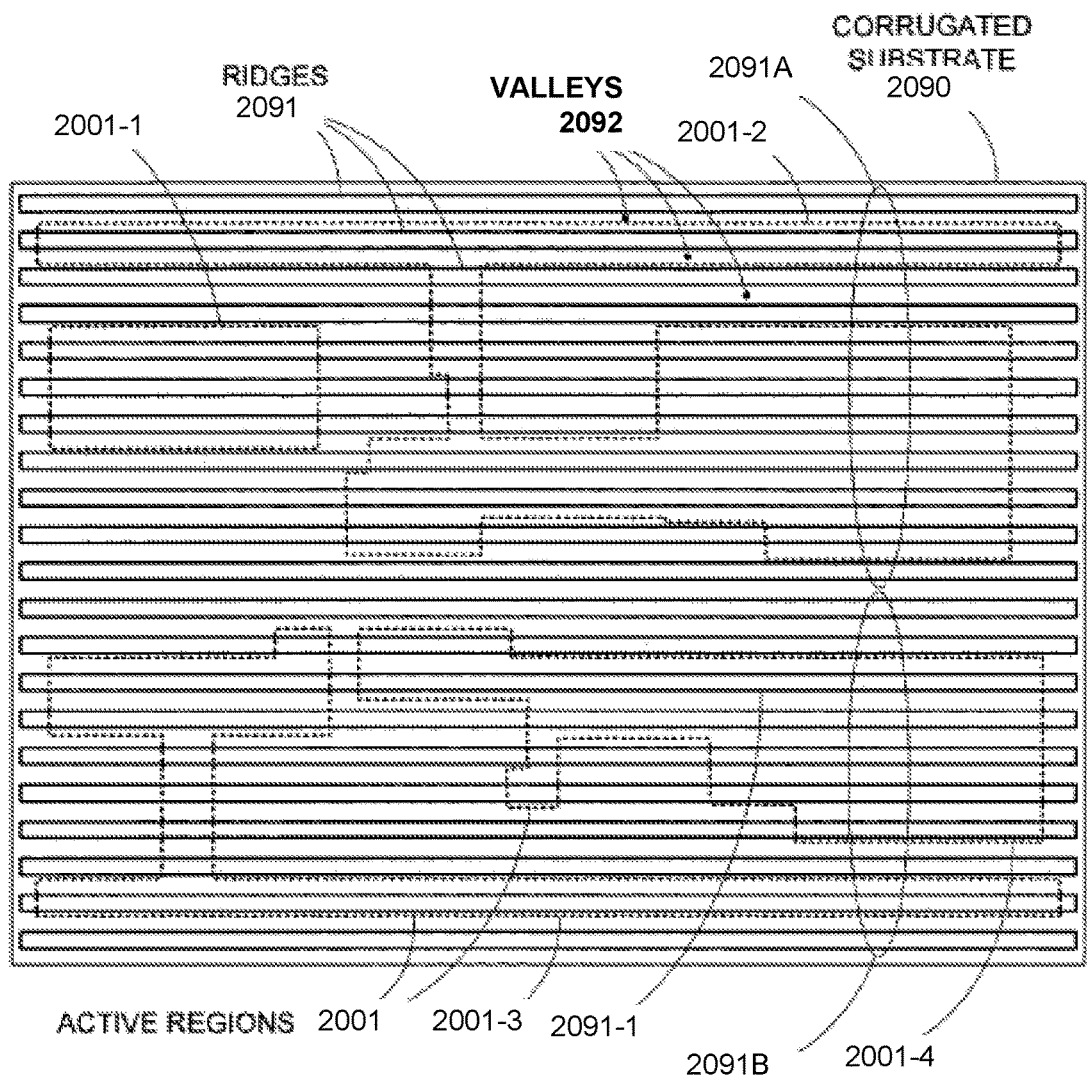

For example, FIG. 20 shows a corrugated substrate 2090 that includes a set of parallel ridges 2091. Ridges 2091 are substantially similar to the ridges described previously, and have a predetermined height HR, width WR, spacing SP, and composition. Active regions 2001 (indicated by the dotted lines) represent locations where functional elements of a circuit are to be formed. While ridges 2091 are dimensionally very similar, the composition of ridges 2091 can vary.

To begin the manufacturing process, the portions of ridges 2091 that lie outside of the active regions 2001 are removed by masking the active regions and etching away the unmasked regions.

Forming Transistor Structures

For the embodiment of FIG. 3, an example fabrication process can start with a silicon wafer with an oxide layer on top. The ridge lines are then patterned, and the valleys between the ridges are etched by conventional means, resulting in a corrugated wafer such as that shown in any of FIG. 19A, 19B, 19C or 19D. The ridges can be made with a ridge-to-ridge spacing as narrow as that described above for the fin-to-fin spacing. Said alternatively, the ridges can be made on a pitch as narrow as that described above for the fin pitch. The wafer can then be stored or sold in this form. Alternatively, the semiconductor 2D material layer can be deposited conformally on top, for example using CVD or ALD, and the wafer can be stored or sold in that form. Alternatively, an HKMG stack such as 318 can be applied over the wafer, and the wafer can be stored or sold in that form. Subsequent patterning of gates and transistors can be performed later. Several techniques and tools that can be used for depositing 2D materials are described in Oxford Instruments, Inc., "Graphene and other 2-dimensional materials" (2014), a brochure from equipment supplier Oxford Instruments, Inc. that is incorporated by reference herein.

For the embodiment of FIG. 4/5, after the corrugated oxide wafer is formed and coated with the semiconductor 2D material layer, the wafer can be coated with the gate stack material (only the high-K dielectric layer, or both the high-K dielectric layer plus the 2D gate conductor material on top). The wafer can then be stored or sold in that form. Again, subsequent patterning of gates and transistors can be performed later.

Similar intermediate corrugated wafer products can be fabricated for the FIG. 6 embodiment.

For the FIG. 7/8 embodiment, a corrugated wafer can be fabricated by starting with a silicon substrate with a layer of oxide on top, and a planar metal layer (or polysilicon or silicon) on top of the oxide. The metal layer is then patterned into stripes oriented transversely to the future ridge direction. Metal remains where future gate conductors will be, and removed between the future gate conductors. The gaps between the metal stripes are then filled with oxide, leaving metal-oxide-metal-oxide stripes parallel to the gates and alternating in the future longitudinal direction. Next, trenches are patterned and etched across (perpendicularly to) the metal-oxide-metal stripes to form corrugation in the direction perpendicular to the gate conductors. The corrugated wafer can be stored or sold in this form as an intermediate product.

Figure 9A:
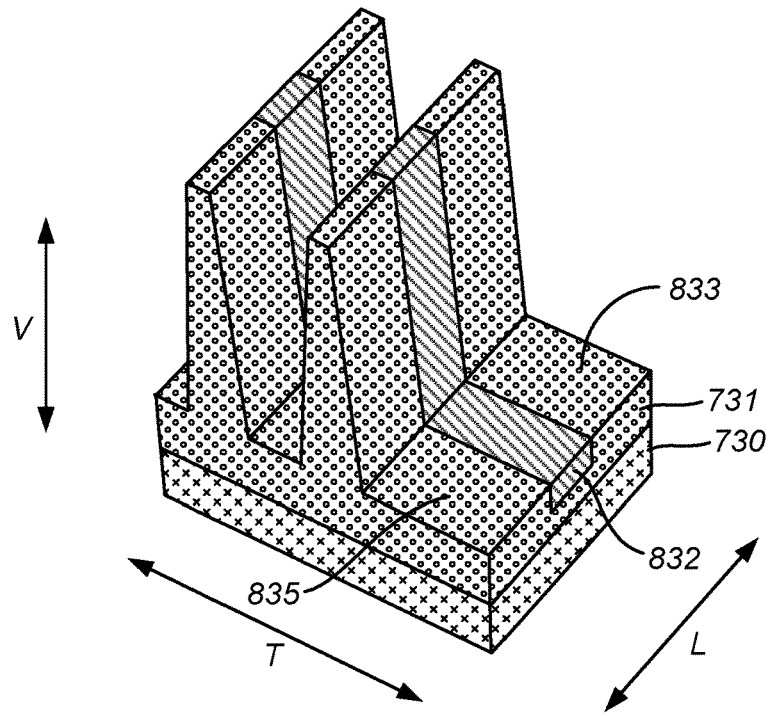
FIGS. 9A, 9B and 9C are perspective views of a transistor made according to the FIG. 7/8 embodiment, at various stages of fabrication, according to an aspect of the invention.
Figure 9B:
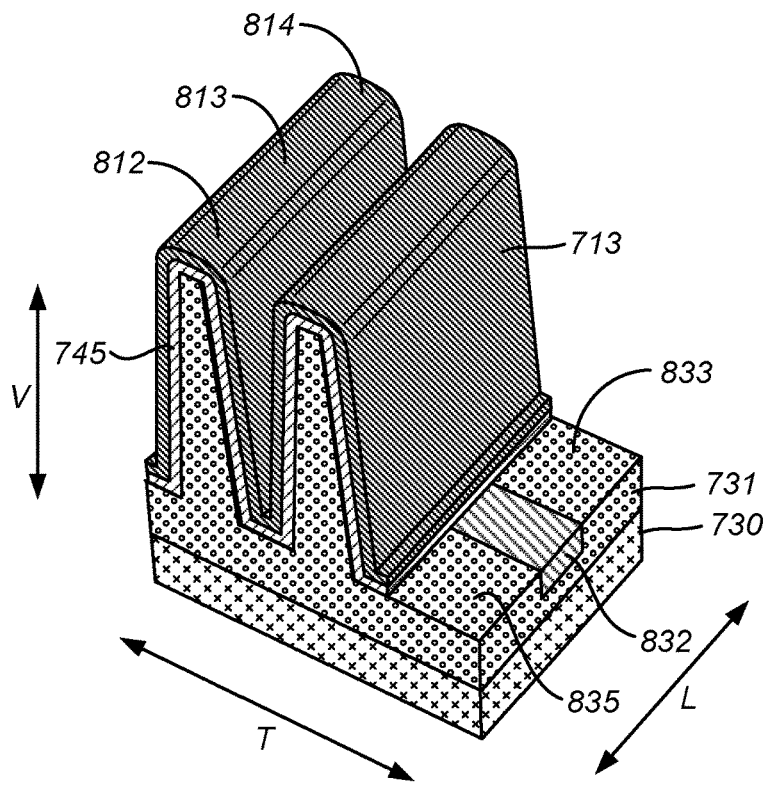
Figure 9C:
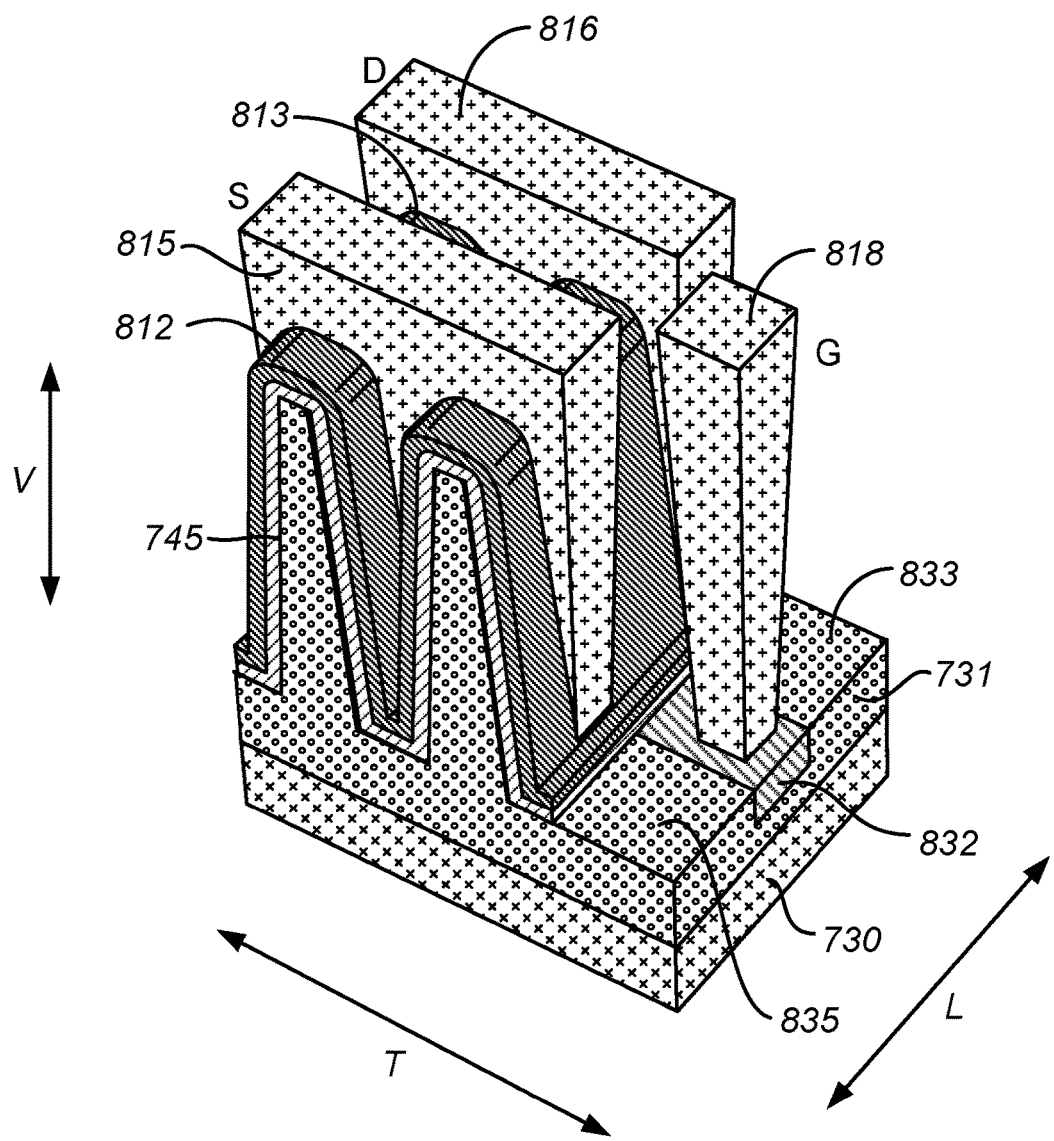

FIGS. 9A, 9B and 9C are perspective views of a transistor made according to the FIG. 7/8 embodiment, at various stages of fabrication. FIG. 9A shows two fins of the corrugated substrate made as just described. The silicon substrate 730 is shown at the bottom, and the oxide fill 731 is shown above it. The left-right stripe 832 is the metal gate material. Because of the fabrication process just described, the metal gate material 832 extends down into the oxide fill 731 as can be seen on the edge of the structure. That is, within the ridges, the metal volume 832 extends into the oxide fill 731 so that the undersurface of all of the metal substantially forms a plane parallel to the silicon support wafer 730. Thus each ridge has oxide/metal volumes alternating in the longitudinal direction.

In FIG. 9B, the gate dielectric layer 745 has been applied, and the semiconductor 2D material layer 713 has been applied above the gate dielectric layer 745. The gate dielectric layer 745 extends longitudinally along the entire fin in the embodiment of FIG. 9B, but in another embodiment it need extend only over the longitudinal segments overlying the metal gate volumes 832. In FIG. 9C, drain, source and gate contacts 816, 815 and 818 have been formed for the transistor. The drain and source contacts 816 and 815 are connected to the drain and source regions 814 and 812 respectively of the semiconductor 2D material layer 713, and the gate contact 818 is connected to the metal gate volume 832. It can be seen that the gate contact 818 is offset from a line joining the drain and source contacts 816 and 815, and therefore more distant from the drain region 814 and the drain contact 816, thereby reducing MOL capacitance.

In yet another embodiment, the corrugated wafer is made using oxide as the ridge material. A thin conductive layer is then deposited on top; a conductive 2D material can be used for this purpose. The corrugated substrate can be stored or sold in this form as an intermediate product. Then later, the conductive layer is patterned and etched so as to retain it only where gate conductors are desired (e.g. under the transistor channels), then high-K dielectric and channel material (for example a semiconductor 2D material layer) are deposited on top. Because the gate material is so thin (just one monolayer of atoms, for example), the channel material surface will be at virtually the same level as source and drain. The corrugated substrate can be stored and sold as an intermediate product after any of the steps mentioned in this paragraph.

In all examples, the corrugated substrate can be formed using known process techniques or any of the process techniques set forth in the King patent. Also, all of the variations shown in FIGS. 3A, 3B, 3C, 3D, 4A, 4B, 4C, 4D, 4E and 5 of the King patent and the accompanying text can be used as appropriate. FIGS. 3A, 3B, 3C, and 3D are top views of different corrugated substrates that can be used in the manufacture of ICs that incorporate transistors having segmented channel regions, and FIGS. 4A, 4B, 4C, 4D, and 4E are steps in a manufacturing process for an IC that incorporates transistors having segmented channel regions.

By creating ridges as standalone structures prior to discrete device definition, the ridges can be formed with a high degree of precision using techniques that would not necessarily be suitable for general IC production (e.g., imprint lithography and spacer lithography). Also, any corrugated substrate can also include passivation added temporarily or permanently on top.

Tree-Shaped Transistors

As noted above, drive strength of a transistor is roughly proportional to channel width. For a transistor formed by depositing a semiconductor 2D channel material layer conformally on the peaks, valleys and sidewall surfaces of a ridge such as those used to make FinFETs, the effective channel width (and therefore drive strength) becomes roughly AR+1 times the width of a planar channel covering the same footprint, where AR is the aspect ratio of the ridge. But as mentioned, a ridge is not the only shape on which a semiconductor 2D channel material layer can be deposited conformally. And even ridges are not required to have smooth walls. In particular, ALD (Atomic Layer Deposition) and CVD (Chemical Vapor Deposition) both can be used to deposit material even on the underside of an overhang.

Figure 10:
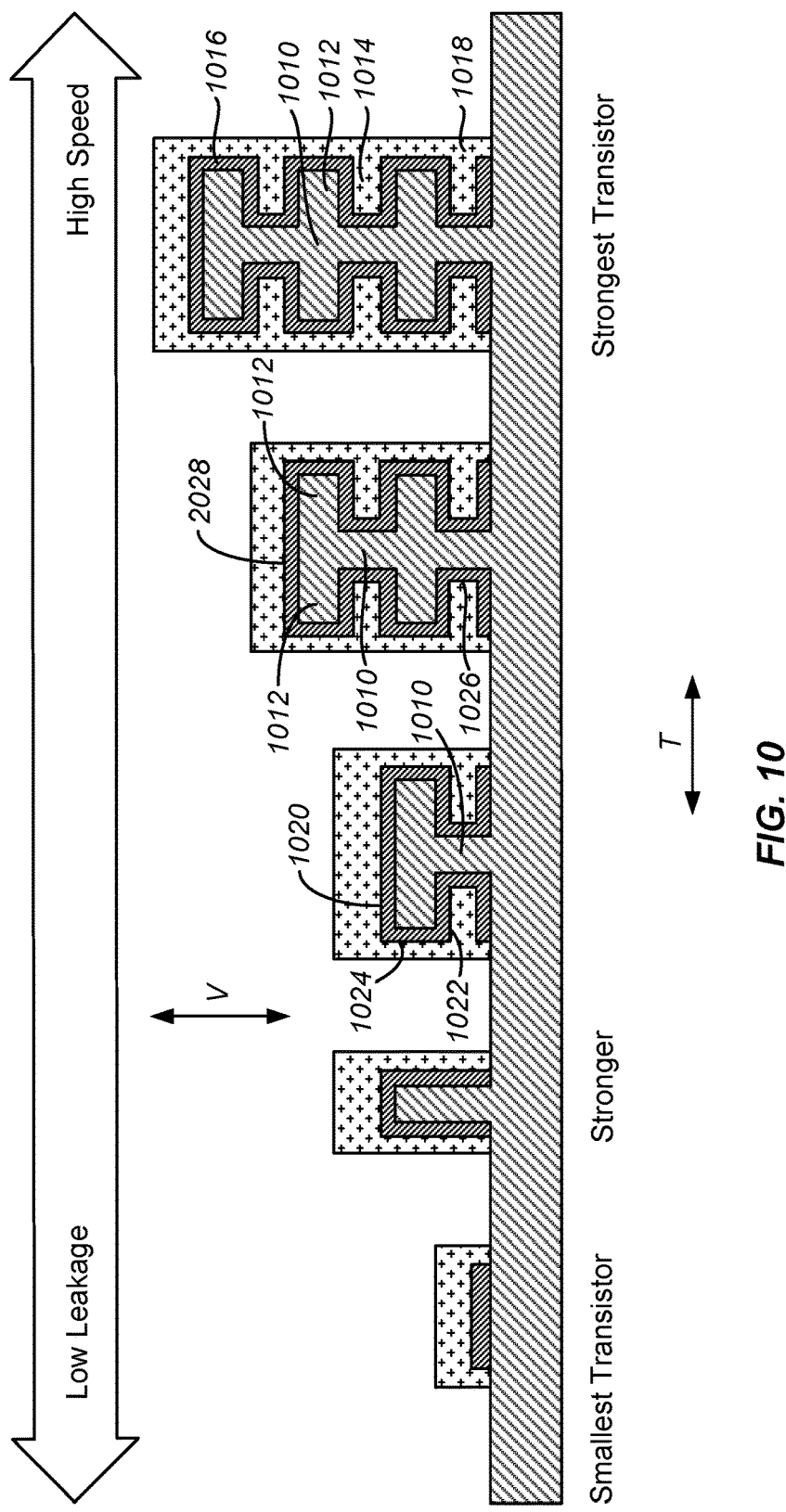
FIG. 10 illustrates a variety of tree-shaped transistors in cross-sectional view, according to an aspect of the invention.

FIG. 10 illustrates a variety of tree-shaped transistors (transistors having a tree-shaped cross-sectional shape) which contain branches 1012 extending transversely from the trunk vertical section 1010, leaving recesses 1014 separating the branches vertically. In these images, transistor cross-sections are shown. Current flows into the page. The body material (trunk sections 1010 and branches 1012) are made of oxide, and the semiconductor 2D material layer 1016 is formed conformally on all surfaces of the body material within at least some particular longitudinal section of the ridge. An HKMG gate stack is formed conformally on the semiconductor 2D material layer 1016.

For these transistors, in transverse dimension the surface length of the structure per unit length across the wafer is greatly increased compared to a simple ridge structure. Thus the channel width formed conformally on this structure, and hence the drive strength of the transistor, can be multiplied accordingly. Most layout designs require a variety of different transistor layouts so that the designer can trade off low leakage in the off-state, with high drive current in the on-state, as needed for a particular region of the circuit. As can be seen, the above tree-shaped structures fully accommodate such varieties. In particular, a tree-shaped transistor which is taller, and contains more branches, has a greater surface on which the semiconductor 2D material layer 1016 is formed, whereas one which is shorter, and contains fewer branches, has a shorter surface on which the 2D channel material is formed. Thus the taller transistor has greater drive current, while the shorter transistor has lower off-state leakage current.

For example, on a given single wafer, different transistors can be made with different heights. In particular, one transistor may have a vertical trunk section 1010 and exactly N>0 branches 1012 extending in one transverse direction from the trunk, the branches superposing one another and each vertically adjacent pair of the branches separated vertically from each other by a respective recess 1014, whereas a second transistor may have a vertical trunk section 1010 and exactly M>0 branches 1012 extending in one transverse direction from the trunk, the branches superposing one another and each vertically adjacent pair of the branches separated vertically from each other by a respective recess 1014, and M≠N. Note that such transistors typically will also have branches, at the same level as each of the branches but not included in the M and N count of branches above, which extend in the opposite transverse direction. Also, in another embodiment some transistors may have a simple ridge shape whereas others can have a tree-shape.

Each branch of the tree shapes in FIG. 10 can be thought of as having an upper surface 1020, a lower surface 1022, and an end surface 2024. The recesses also have inner surfaces 1026 on the vertical trunk sections 1010. In the embodiments of FIG. 10, all of such surfaces, as well as the top surfaces 1028, have the semiconductor 2D material layer 1016 formed conformally thereon. In another embodiment, not all of such surfaces need to be coated. In one embodiment, for example, only the top surfaces 2028, the upper tree branch surfaces 1020, and the branch end surfaces 1024 may be coated. The device will also still act as a single transistor if the multiple transversely separated segments are connected together by a single source region and a single drain region.

FIG. 11 (consisting of FIGS. 11A through 11M) illustrates a method for fabricating tree-shaped transistors. FIGS. 11A through 11H show the structure in cross-sectional view, and FIGS. 11I through 11L show the structure in side elevational view. FIG. 11M shows the structure in top view. At any stage from FIG. 11A through FIG. 11E, different parts of the wafer can be masked while other parts of the device are etched, so that transistors made from the etched tree structures are shorter and have fewer branches. Also, as described above with respect to fin-shaped ridges, the structures of FIG. 11 can be formed as long tree-shaped ridges (oriented into the page in FIG. 11), and at any of the stages of completion of FIG. 11, can be packaged and sold as a corrugated substrate.

Figure 11A:
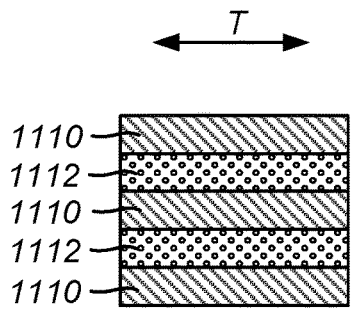
Figure 11B:
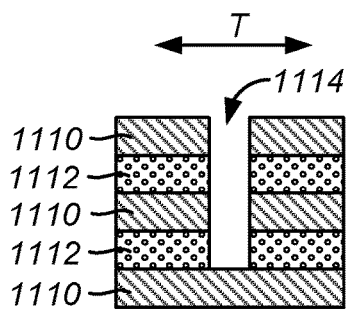
Figure 11C:
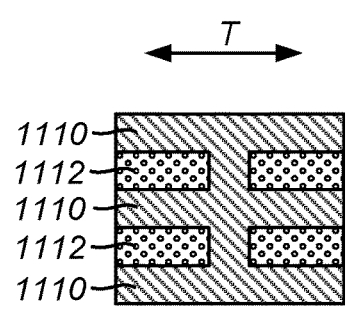
Figure 11D:
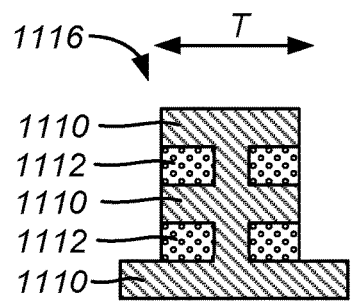
Figure 11E:
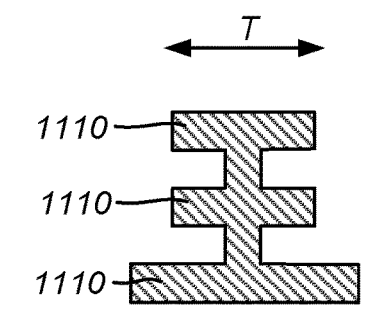
Figure 11F:
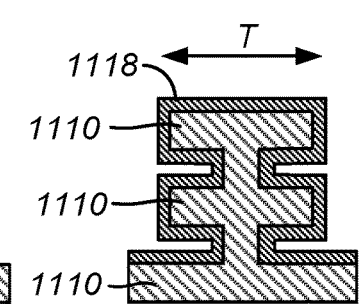
Figure 11G:
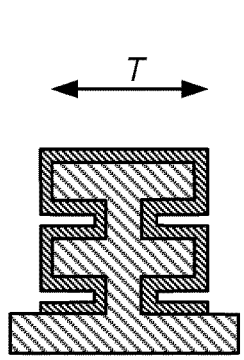
Figure 11H:
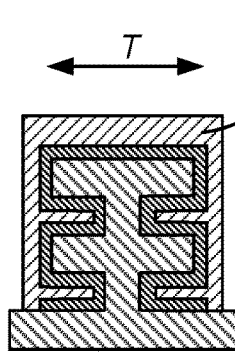
Figure 11I:
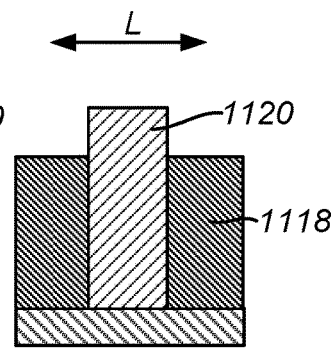
Figure 11M:
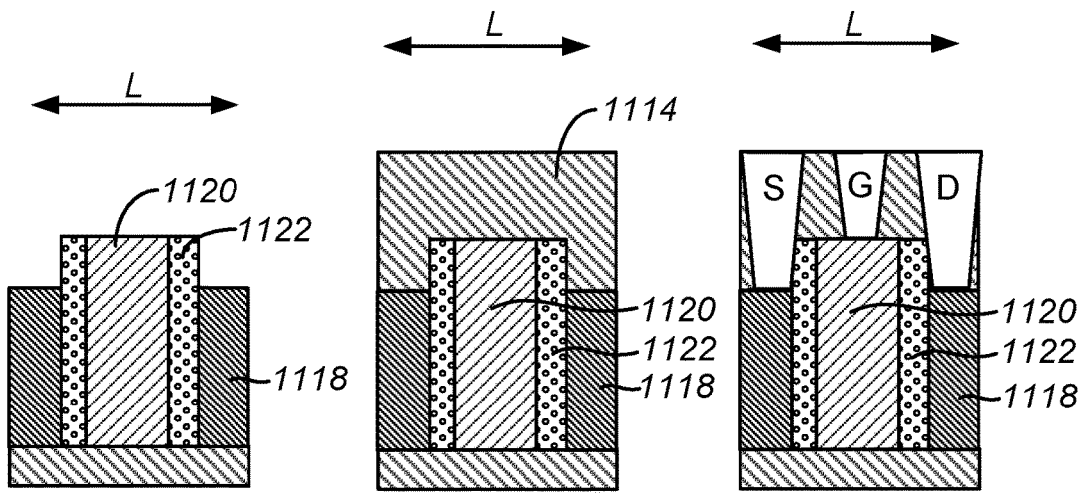
Figure 11M:
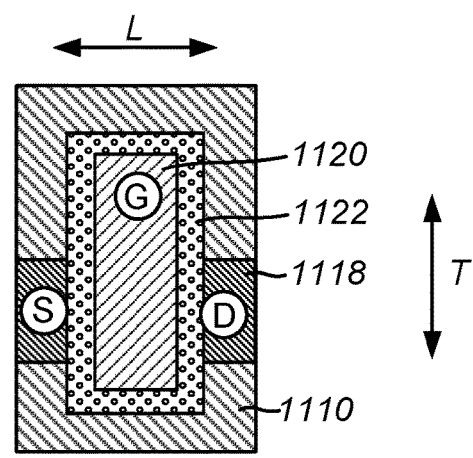

In FIG. 11A, alternating layers of dielectric material 1110 and filler material 1112 are deposited on a substrate (not shown). In FIG. 11B, a trench 1114 is opened for a trunk section of the tree. In FIG. 11C, the trench 1114 is filled with the dielectric material 1110. In FIG. 11D, longitudinally oriented trenches are etched into the structure to thereby leave longitudinally oriented ridges such as ridge 1116. In FIG. 11E, the filler material 1112 is removed. In FIG. 11F the semiconductor 2D material layer 1118 is deposited conformally on the surfaces of the tree structure. In FIG. 11G the semiconductor 2D material layer 1118 is patterned, for example by removing such layer from the valleys between some of the ridges. In FIG. 11H the HKMG stack 1120 is deposited conformally on the semiconductor 2D material layer 1118, along the entire length of the ridge longitudinally. In FIG. 11I it is patterned to expose drain and source regions of the semiconductor 2D material layer 1118. In FIG. 11J spacers 1122 are formed between the HKMG stack and each of the drain and source regions of the semiconductor 2D material layer 1118, and in FIG. 11K an interlayer dielectric 1124 is deposited on top. Vias are opened in the interlayer dielectric layer 1124 in FIG. 11L and the drain, source and drain terminals are deposited in the vias. FIG. 11M is a top view of the resulting transistor.

Library Cell Layouts

Figure 13:
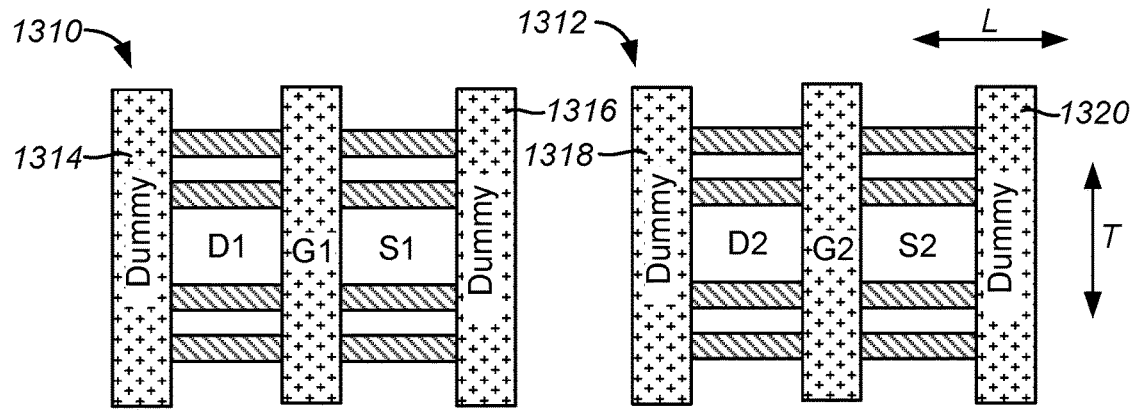
FIGS. 13, 14 and 15 show layouts for library cells using conventional FinFET transistors.
Figure 14:
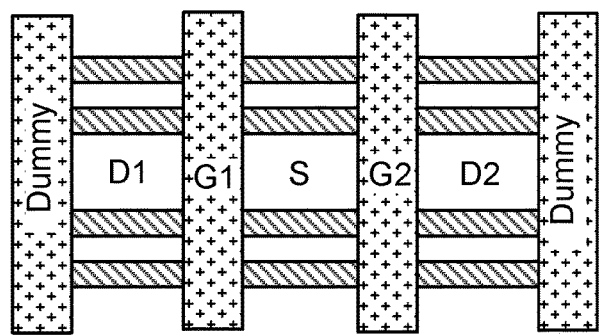
Figure 15:
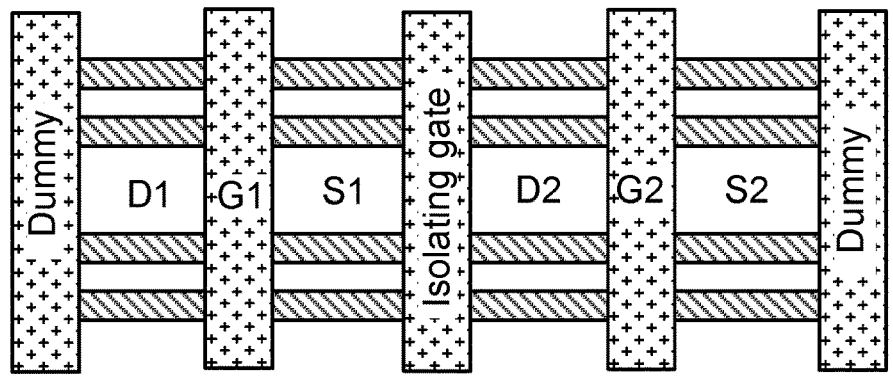

FIGS. 13, 14 and 15 show layouts for library cells for conventional FinFET transistors. The horizontal lines in these drawings represent ridges, and the vertical lines represent gate stacks. For simplicity of illustration, each transistor in these drawings uses two adjacent fins, and the upper pair of fins are doped for one conductivity type whereas the lower pair of fins are doped for the opposite conductivity type. The layout of FIG. 13 forms two CMOS inverters 1310 and 1312, separated from one another longitudinally. FinFET transistors can be separated longitudinally by cutting the fins, but dummy gates are required in order to terminate a fin. So the conventional layout of FIG. 13 includes four dummy gate conductors 1314, 1316, 1318 and 1320 at the two ends of each fin longitudinally in each of the inverters.

When possible, a cell shares diffusion regions among transistors in order to reduce the required area. FIG. 14 shows a conventional cell that has two inverters sharing a source region along each of their fins. The two inverters are laid out next to each other longitudinally, with a shared source in between. Again, however, dummy gate conductors are still required at the two ends of each fin longitudinally.

The longitudinal space required for two longitudinally spaced inverters as in FIG. 13, which do not share a diffusion region, can be reduced somewhat by placing an isolation dummy gate conductor between the inverters as illustrated in FIG. 15. However, there is some leakage through the isolating transistor.

Figure 16:
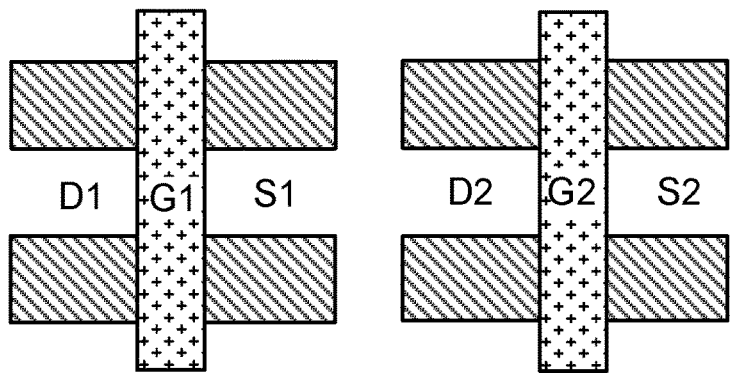
FIGS. 16 and 17 show layouts for library cells using certain FinFET transistors according to an aspect of the invention.
Figure 17:
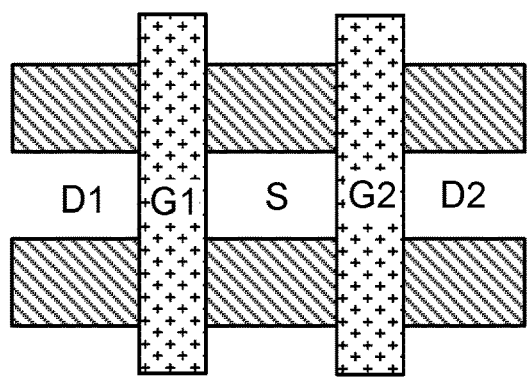

For transistors made from 2D channel materials as described herein, however, no dummy gate conductors are needed to terminate a ridge. Thus for a cell having two longitudinally spaced inverters such as in FIG. 13, the layout tool using aspects of the present invention can place the two inverters much closer to each other longitudinally as illustrated in FIG. 16. No longitudinal space is needed for the placement of dummy gate conductors, and no leakage among the fins of the two inverters will occur as with an isolating dummy gate conductor. Similarly, when the two inverters can share a diffusion region as in FIG. 14, again longitudinal space requirements can be reduced by omitting any dummy fin termination gate conductors as shown in FIG. 17. Thus in an aspect of the invention, the area penalty imposed due to the requirement for dummy gates as in FIGS. 13, 14 and 15 can be eliminated.

In the embodiments of FIGS. 16 and 17, the wide horizontal lines represent two or more parallel horizontal ridges; but since the semiconductor 2D material layer that covers them also covers the valley between them, the spacing between the ridges is not visible in these drawings. Also, the ridges in FIGS. 16 and 17 can be tree-shaped as described above.

The layout tool can be designed to lay out transistors without dummy gates to terminate ridges longitudinally. Also, in some embodiments a gate conductor is not allowed to extend continuously across both an NMOS ridge and a PMOS ridge. In such embodiments the layout tool breaks such a gate conductor into an NMOS piece and a PMOS piece. If necessary, the layout tool connects the two segments together in higher metal layers (not shown).

Other Aspects

In order to develop fabrication processes to produce the above structures, it is extremely desirable to simulate the fabrication process flow. This can be done using a process simulator program such as Sentaurus Process, available from Synopsys, Inc. Some example methods and systems that can be used to do so in such a program are described in U.S. patent application Ser. No. 14/699,162, filed 29 Apr. 2015, entitled 3D TCAD SIMULATION, by inventors Arsen Terterian and Tommaso Cilento, incorporated by reference herein.

In addition, once a device structure is designed using the above techniques, it is often important to extract the various parameters of the device for use in circuit simulators such as SPICE. Extraction of such parameters can be performed by Sentaurus Device, software available from Synopsys, Inc.

A circuit or layout that includes transistors or other devices according to the embodiments above also can be designed in advance and provided to designers as a macrocell (which as used herein can be a standard cell). It is common for integrated circuit designers to take advantage of macrocells that have been pre-designed for particular kinds of circuits, such as logic gates, larger logic functions, memory and even entire processors or systems. These macrocells are provided in a library available from various sources, such as foundries, ASIC companies, semiconductor companies, third party IP providers, and even EDA companies, and used by designers when designing larger circuits. Each macrocell typically includes such information as a graphical symbol for schematic drawings; text for a hardware description language such as Verilog; a netlist describing the devices in the included circuit, the interconnections among them, and the input and output nodes; a layout (physical representation) of the circuit in one or more geometry description languages such as GDSII; an abstract of the included geometries for use by place-and-route systems; a design rule check deck; simulation models for use by logic simulators and circuit simulators; and so on. Some libraries may include less information for each macrocell, and others may include more. In some libraries the entries are provided in separate files, whereas in others they are combined into a single file, or one file containing the entries for multiple different macrocells. In all cases the files are either stored and distributed on a computer readable medium, or delivered electronically and stored by the user on a computer readable medium. Macrocell libraries often contain multiple versions of the same logic function differing in area, speed and/or power consumption, in order to allow designers or automated tools the option to trade off among these characteristics. In an aspect of the invention, a macrocell library includes tree-shaped transistors of different heights for this purpose.

For macrocells that include device structures as described above, the simulation models have parameters extracted from the devices, and the layout includes shapes appropriate to make masks for fabricating the device structures.

Integrated Circuit Manufacturing Flow

Figure 21:
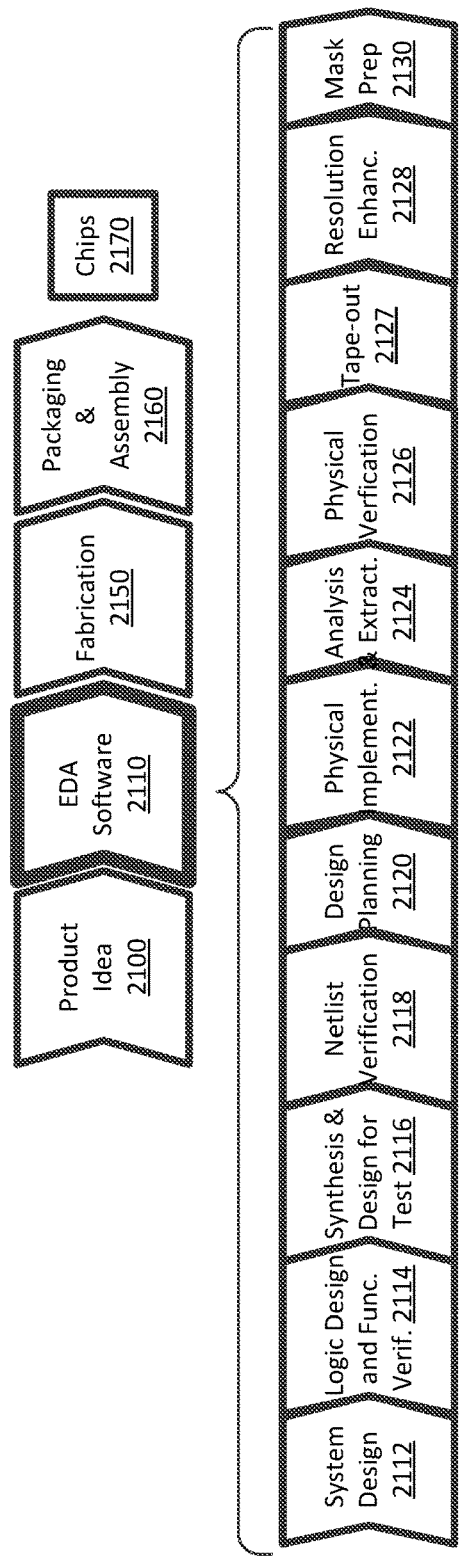
FIG. 21 shows a simplified representation of an illustrative integrated circuit design flow incorporating features of the technology.

FIG. 21 shows a simplified representation of an illustrative integrated circuit design flow incorporating features of the technology. At a high level, the process starts with the product idea (step 2100) and is realized in an EDA (Electronic Design Automation) software design process (step 2110). When the design is finalized, it can be taped-out (step 2140). After tape out, the fabrication process (step 2150) and packaging and assembly processes (step 2160) occur resulting, ultimately, in finished integrated circuit chips (result 2170).

The EDA software design process (step 2110) is actually composed of a number of steps 2112-2130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 2110) will now be provided.

System design (step 2112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 2114): At this stage, the VHDL or Verilog code for modules in the system is written and the design is checked for functional accuracy. More specifically, the design is checked to ensure that produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (step 2116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, Tetramax, and DesignWare® products.

Netlist verification (step 2118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 2120): Here, an overall floor plan for the chip is constructed and analyzed for timing and top-level routing. Example EDA software products from Synopsys, Inc. that can be used at this step include Astro and IC Compiler products.

Physical implementation (step 2122): The placement (positioning of circuit elements) and routing (connection of the same) occurs at this step. Example EDA software products from Synopsys, Inc. that can be used at this step include the Astro and IC Compiler products. Aspects of the invention can be used in this step of the manufacturing flow.

Analysis and extraction (step 2124): At this step, the circuit function is verified at a transistor level, this in turn permits what-if refinement. Example EDA software products from Synopsys, Inc. that can be used at this step include AstroRail, PrimeRail, Primetime, and Star RC/XT products. Aspects of the invention can be used in this step of the manufacturing flow.

Physical verification (step 2126): At this step various checking functions are performed to ensure correctness for: manufacturing, electrical issues, lithographic issues, and circuitry. Example EDA software products from Synopsys, Inc. that can be used at this step include the Hercules product. Aspects of the invention can be used in this step of the manufacturing flow.

Tape-out (step 2127): This step provides the "tape out" data for production of masks for lithographic use to produce finished chips. Example EDA software products from Synopsys, Inc. that can be used at this step include the CATS(R) family of products.

Resolution enhancement (step 2128): This step involves geometric manipulations of the layout to improve manufacturability of the design. Example EDA software products from Synopsys, Inc. that can be used at this step include Proteus, ProteusAF, and PSMGen products.

Mask data preparation (step 2130): This step provides the "tape-out" data for production of masks for lithographic use to produce finished chips. Example EDA software products from Synopsys, Inc. that can be used at this step include the CATS(R) family of products.

A typical integrated circuit manufacturing flow also includes a parallel flow, as follows:

(1) Develop individual process steps for manufacturing the integrated circuit. This can be modeled with the Synopsys tools "Sentaurus Process", "Sentaurus Topography", and "Sentaurus Lithography". The input information here include masks or layout information, and process conditions like temperature, reactor ambient, implant energy, etc. The output information is the final geometry or doping profiles or stress distribution. Aspects of the invention can be used in this step of the manufacturing flow.

(2) Integrate the individual process steps into the complete process flow. This can be modeled with the Synopsys tool "Sentaurus Process". The input information here includes the layout information and the collection of the process steps in the appropriate sequence. The output includes the geometry, the doping profiles, and the stress distribution for the transistors and the space in between the transistors. Aspects of the invention can be used in this step of the manufacturing flow.

(3) Analyze performance of the transistor manufactured with this process flow. This can be done with the Synopsys tool "Sentaurus Device". The input information here includes the output of step (2) and the biases applied to transistor terminals. The output information includes the currents and capacitances for each bias combination. Aspects of the invention can be used in this step of the manufacturing flow.

(4) If necessary, modify the process steps and the process flow to achieve the desired transistor performance. This can be done iteratively by using the Synopsys tools mentioned above.

Once the process flow is ready, it can be used for manufacturing multiple circuit designs coming from various designers in various companies. The EDA flow 2112-2130 will be used by such designers. The parallel flow described here is used at a foundry to develop a process flow that can be used to manufacture designs coming from the designers. A combination of the process flow and the masks made from step 2130 are used to manufacture any particular circuit. If the designers are at a different company, e.g. a fabless company, then usually it is the foundry that performs this parallel process flow whereas the process steps of FIG. 9 are performed typically by the fabless company. If the integrated circuit is manufactured at an IDM (integrated device manufacturer) company instead of the combination of a fabless company and a foundry, then both parallel flows described above are done at the same IDM company.

There is also a bridge between these tools and the 2112-2130 EDA tools. The bridge is a Synopsys tool "Seismos" that applies compact proximity models for particular circuit design and layout to obtain netlist with instance parameters for each individual transistor in the circuit as a function of its neighborhood and stress, including material conversion stress. This netlist is used in the analysis step 2124.

Computer Hardware

Figure 12:
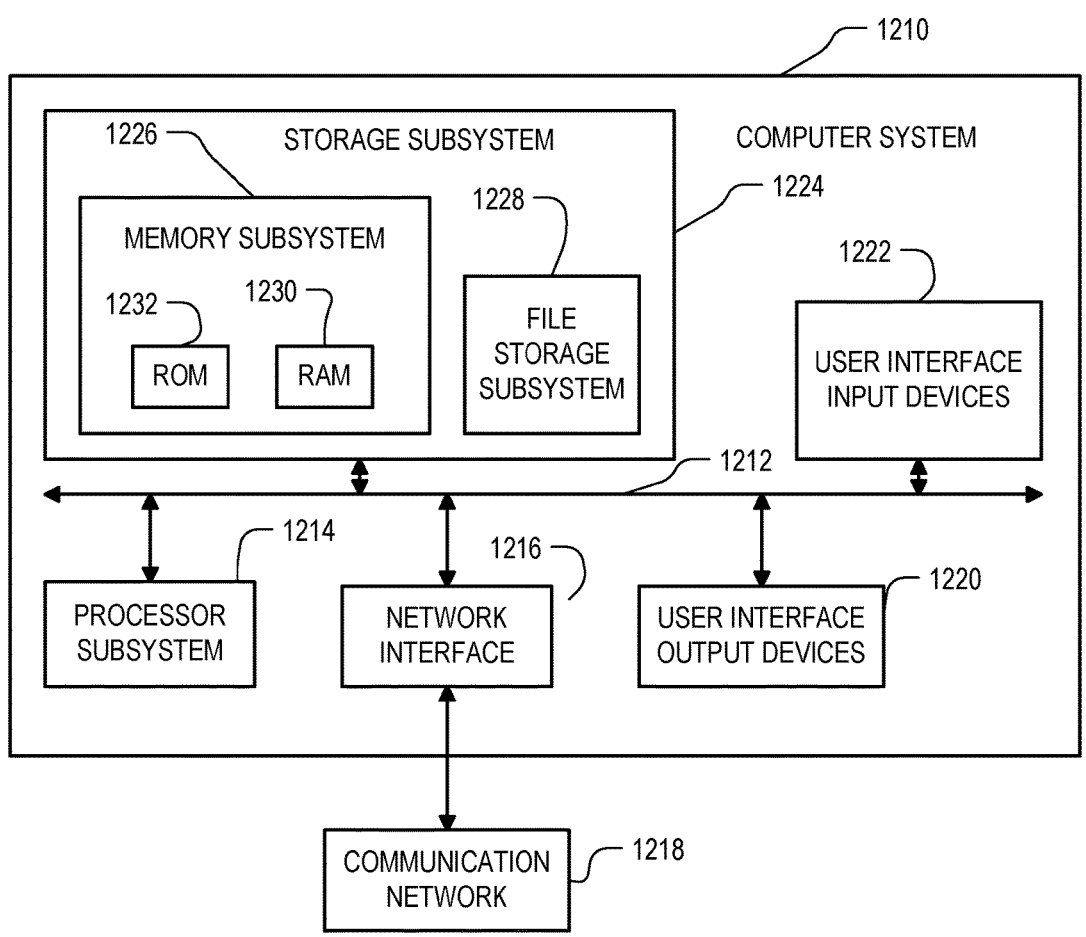
FIG. 12 is a simplified block diagram of a computer system that can be used to implement software incorporating aspects of the present invention.

FIG. 12 is a simplified block diagram of a computer system 1210 that can be used to implement software incorporating aspects of the present invention. Computer system 1210 typically includes a processor subsystem 1214 which communicates with a number of peripheral devices via bus subsystem 1212. These peripheral devices may include a storage subsystem 1224, comprising a memory subsystem 1226 and a file storage subsystem 1228, user interface input devices 1222, user interface output devices 1220, and a network interface subsystem 1216. The input and output devices allow user interaction with computer system 1210. Network interface subsystem 1216 provides an interface to outside networks, including an interface to communication network 1218, and is coupled via communication network 1218 to corresponding interface devices in other computer systems. Communication network 1218 may comprise many interconnected computer systems and communication links. These communication links may be wireline links, optical links, wireless links, or any other mechanisms for communication of information, but typically it is an IP-based communication network. While in one embodiment, communication network 1218 is the Internet, in other embodiments, communication network 1218 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 1222 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 1210 or onto computer network 1218.

User interface output devices 1220 may include a display subsystem, a printer, a fax machine, or non visual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 1210 to the user or to another machine or computer system.

Storage subsystem 1224 stores the basic programming and data constructs that provide the functionality of certain embodiments of the present invention. For example, the various modules implementing the functionality of certain embodiments of the invention may be stored in storage subsystem 1224. These software modules are generally executed by processor subsystem 1214.

Memory subsystem 1226 typically includes a number of memories including a main random access memory (RAM) 1230 for storage of instructions and data during program execution and a read only memory (ROM) 1232 in which fixed instructions are stored. File storage subsystem 1228 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 1228. The host memory 1226 contains, among other things, computer instructions which, when executed by the processor subsystem 1214, cause the computer system to operate or perform functions as described herein. As used herein, processes and software that are said to run in or on "the host" or "the computer", execute on the processor subsystem 1214 in response to computer instructions and data in the host memory subsystem 1226 including any other local or remote storage for such instructions and data.

Bus subsystem 1212 provides a mechanism for letting the various components and subsystems of computer system 1210 communicate with each other as intended. Although bus subsystem 1212 is shown schematically as a single bus, alternative embodiments of the bus subsystem may use multiple busses.

Computer system 1210 itself can be of varying types including a personal computer, a portable computer, a workstation, a computer terminal, a network computer, a television, a mainframe, a server farm, or any other data processing system or user device. Due to the ever changing nature of computers and networks, the description of computer system 1210 depicted in FIG. 12 is intended only as a specific example for purposes of illustrating the preferred embodiments of the present invention. Many other configurations of computer system 1210 are possible having more or less components than the computer system depicted in FIG. 12.

Clauses

The following clauses point out various features of the invention.

Clause A1. An integrated circuit structure having a transistor device which comprises:

a three-dimensional body having longitudinal and transverse dimensions and further having at least first and second non-coplanar surfaces disposed transversely from one another on the body;

a semiconductor 2D material layer disposed conformally on the body so as to overlie at least the first and second surfaces along a particular longitudinal segment of the body; and source, gate and drain terminals connected to the device, at least one of the source and drain terminals connected to the semiconductor 2D material layer.

Clause A2. The structure of clause A1, further comprising a gate conductor connected to the gate terminal and overlying a channel portion of the semiconductor 2D material layer.

Clause A3. The structure of clause A1, comprising a gate conductor connected to the gate terminal and underlying a channel portion of the semiconductor 2D material layer.

Clause A4. The structure of clause A1, wherein the body is a dielectric, wherein the semiconductor 2D material layer includes a channel region disposed longitudinally between source and drain regions of the semiconductor 2D material layer, further comprising a gate conductor disposed conformally on the semiconductor 2D material layer longitudinally so to overlie the channel region and transversely so as to overlie both the first and second surfaces, the gate conductor separated from the semiconductor 2D material layer by a gate dielectric layer, and wherein the source, gate and drain terminals are connected to the source region, the drain region, and the gate conductor, respectively.

Clause A5. The structure of clause A4, wherein the gate conductor comprises a 2D material layer.

Clause A6. The structure of clause A4, wherein the gate dielectric layer comprises a 2D material layer.

Clause A7. The structure of clause A4, wherein the gate terminal is offset transversely from a line joining the source and drain terminals.

Clause A12. The structure of clause A1, wherein the body comprises a three-dimensional conductive volume disposed longitudinally between first and second three-dimensional dielectric volumes of the body, wherein the semiconductor 2D material layer has a channel region overlying at least part of the conductive volume and further having source and drain regions overlying respectively the first and second dielectric volumes, the channel region being separated from at least the conductive volume by a gate dielectric layer, wherein the source and drain terminals are connected to the source and drain regions of the semiconductor 2D material layer, and the gate terminal is connected to the gate conductor.

Clause A13. The structure of clause A12, wherein the three-dimensional conductive volume comprises a metal.

Clause A14. The structure of clause A12, wherein the three-dimensional conductive volume comprises a heavily doped semiconductor.

Clause A15. The structure of clause A12, wherein the gate dielectric layer comprises a 2D material layer.

Clause A16. The structure of clause A12, wherein the gate terminal is offset transversely from a line joining the source and drain terminals.

Clause A22. The structure of clause A1, wherein the body is a dielectric, wherein the semiconductor 2D material layer includes a channel region disposed longitudinally between source and drain regions of the semiconductor 2D material layer, further comprising a gate conductor disposed conformally on the body so to underlie the channel region and transversely so as to overlie both the first and second surfaces, the gate conductor separated from the semiconductor 2D material layer by a gate dielectric layer, and wherein the source, gate and drain terminals are connected to the source region, the drain region, and the gate conductor, respectively.

Clause A23. The structure of clause A22, wherein the gate conductor comprises a 2D material layer.

Clause A24. The structure of clause A22, wherein the gate dielectric layer comprises a 2D material layer.

Clause A25. The structure of clause A22, wherein the gate terminal is offset transversely from a line joining the source and drain terminals.

Clause A31. The structure of clause A1, wherein the first and second non-coplanar surfaces are separated from each other transversely.

Clause A32. The structure of clause A1, wherein the three-dimensional body comprises a ridge extending vertically from a substrate, the ridge having first and second opposite walls and a top,
wherein the first and second non-coplanar surface are disposed on the first and second walls, respectively.

Clause A33. The structure of clause A1, wherein the three-dimensional body comprises a ridge extending vertically from a substrate, the ridge having first and second opposite walls and a top,
wherein the first and second non-coplanar surface are disposed on the first wall and the top, respectively.

Clause A34. The structure of clause A1, wherein the three-dimensional body comprises a plurality of transversely adjacent parallel ridges each extending vertically from a substrate, each of the ridges having two opposite walls and a respective peak between them, and each transversely adjacent pair of the parallel ridges joined transversely by a respective valley.

Clause A35. The structure of clause A34, wherein the semiconductor 2D material overlies all of the walls, peaks and valleys of the plurality of ridges within the particular longitudinal segment of the body.

Clause A36. The structure of clause A34, wherein the semiconductor 2D material overlies all of the walls and valleys of the plurality of ridges, but not any of the peaks of the plurality of ridges, within the particular longitudinal segment of the body.

Clause A37. The structure of clause A34, wherein the first and second non-coplanar surface are disposed on the extreme transversely opposite walls of the plurality of ridges.

Clause A40. The structure of clause A1, wherein the three-dimensional body comprises a ridge extending vertically from a substrate, the ridge having tree-shaped cross-section.

Clause A41. The structure of clause A40, wherein the semiconductor 2D material layer is disposed conformally on all surfaces of the ridge along the particular longitudinal segment of the body.

Clause A42. The structure of clause A40, wherein the cross-sectional shape includes a vertical trunk section and at least one branch extending transversely from the trunk section.

Clause A43. The structure of clause A40, wherein the cross-sectional shape includes a vertical trunk section having a plurality of branches extending transversely from the trunk section, an upper one of the branches overlying a lower one of the branches and separated vertically from the lower branch by a recess.

Clause A44. The structure of clause A43, wherein the upper and lower branches each have upper, lower and end surfaces,
and wherein the semiconductor 2D material layer is disposed conformally on the upper and end surfaces of both the upper and lower branches along the particular longitudinal segment of the body.

Clause A45. The structure of clause A43, wherein the upper and lower branches each have upper, lower and end surfaces, and wherein the trunk section has a top surface,
and wherein the semiconductor 2D material layer is disposed conformally on the top surface and the upper and end surfaces of both the upper and lower branches along the particular longitudinal segment of the body.

Clause A50. The structure of clause A40, further having a second transistor device having a second three-dimensional body which comprises a second ridge extending vertically from the substrate, the second ridge having a smooth walled cross-section.

Clause A51. The structure of clause A50, wherein each of the branches has a respective upper, lower and end surface,
wherein the semiconductor 2D material layer is disposed conformally on at least the upper and end surfaces of each of the branches along the particular longitudinal segment of the body
and wherein the semiconductor 2D material layer is disposed conformally on at least the walls of the second ridge.

Clause A55. The structure of clause A40, wherein the cross-sectional shape of the three-dimensional body includes a vertical trunk and exactly N>0 branches extending in one transverse direction from the trunk, the branches superposing one another and each vertically adjacent pair of the branches separated vertically from each other by a respective recess,
the structure further having a second transistor device having a second three-dimensional body which comprises a second ridge extending vertically from the substrate, the second ridge having second tree-shaped cross-section,
the second cross-sectional shape including a second vertical trunk having exactly M>0 second branches extending in one transverse direction from the second trunk, the second branches superposing one another and each vertically adjacent pair of the second branches separated vertically from each other by a respective recess,
where M≠N.

Clause A56. The structure of clause A55, wherein the cross-sectional shape of the second three-dimensional body further has a branch extending from the second trunk in a direction transversely opposite that of the second branches.

Clause A57. The structure of clause A55, wherein each of the branches has a respective upper, lower and end surface,
and wherein the semiconductor 2D material layer is disposed conformally on at least the upper and end surfaces of each of the branches along a longitudinal segment of the body.

Clause AM1. A method of making an integrated circuit structure having a transistor device, comprising:
providing a three-dimensional body having longitudinal and transverse dimensions and further having at least first and second non-coplanar surfaces disposed transversely from one another on the body;

forming a semiconductor 2D material layer conformally on the body so as to overlie at least the first and second surfaces along a particular longitudinal segment of the body; and forming source, gate and drain terminals connected to the device, at least one of the source, gate and drain terminals being connected to the semiconductor 2D material layer.

This aspect of the invention further includes dependent aspects corresponding to the dependent aspects mentioned above under Clause A1.

Clause B1. An integrated circuit transistor device comprising:

a first ridge having longitudinal and transverse dimensions, the first ridge having first and second opposite sidewalls and a peak;

a semiconductor 2D material layer disposed conformally on the ridge so as to overlie at least the first and second sidewalls of the first ridge along a particular longitudinal segment of the ridge; and source, gate and drain terminals connected to the device, at least one of the source and drain terminals connected to the semiconductor 2D material layer.

Clause B2. The structure of clause B1, further comprising a gate conductor connected to the gate terminal and overlying a channel portion of the semiconductor 2D material layer.

Clause B3. The structure of clause B1, comprising a gate conductor connected to the gate terminal and underlying a channel portion of the semiconductor 2D material layer.

Clause B4. The structure of clause B1, wherein the ridge comprises a dielectric material, wherein the semiconductor 2D material layer includes a channel region disposed longitudinally between source and drain regions of the semiconductor 2D material layer, further comprising a gate conductor disposed conformally on the semiconductor 2D material layer longitudinally so to overlie the channel region, the gate conductor separated from the semiconductor 2D material layer by a gate dielectric layer, and wherein the source, gate and drain terminals are connected to the source region, the drain region, and the gate conductor, respectively.

Clause B5. The structure of clause B1, wherein the ridge comprises a conductive segment of the ridge disposed longitudinally between first and second dielectric segments of the ridge, wherein the semiconductor 2D material layer includes a channel region disposed longitudinally between source and drain regions of the semiconductor 2D material layer, the channel region overlying at least part of the conductive segment of the ridge and the source and drain regions overlying respectively the first and second dielectric segments of the ridge, the channel region being separated from at least the conductive segment of the ridge by a gate dielectric layer, wherein the source and drain terminals are connected to the source and drain regions of the semiconductor 2D material layer, and the gate terminal is connected to the conductive segment of the ridge.

Clause B6. The structure of clause B1, wherein the ridge comprises a dielectric material, wherein the semiconductor 2D material layer includes a channel region disposed longitudinally between source and drain regions of the semiconductor 2D material layer, further comprising a gate conductor disposed conformally on the ridge so to underlie the channel region, the gate conductor separated from the semiconductor 2D material layer by a gate dielectric layer, and wherein the source, gate and drain terminals are connected to the source region, the drain region, and the gate conductor, respectively.

Clause BM1. A method of making an integrated circuit transistor device comprising:

providing a first ridge having longitudinal and transverse dimensions, the first ridge having first and second opposite sidewalls and a peak;

forming a semiconductor 2D material layer conformally on the ridge so as to overlie at least the first and second sidewalls of the first ridge along a particular longitudinal segment of the ridge; and forming source, gate and drain terminals connected to the device, at least one of the source and drain terminals connected to the semiconductor 2D material layer.

This aspect of the invention further includes dependent aspects corresponding to the dependent aspects mentioned above under Clause B1.

Clause C1. A wafer comprising:

a first plurality of elongated parallel protrusions on a substrate, each of the protrusions elongated in a respective longitudinal dimension and further having a respective transverse dimension, each of the protrusions further having at least first and second non-coplanar surfaces also elongated in the respective longitudinal dimension and disposed transversely from one another on the respective protrusion; and a semiconductor 2D material layer disposed conformally on the protrusions so as to overlie at least the first and second surfaces of each of the protrusions, at least along respective longitudinal segments of the respective protrusion.

Clause C2. The wafer of clause C1, further comprising a dielectric layer disposed conformally on the protrusions so as to overlie at least part of the semiconductor 2D material layer.

Clause C3. The wafer of clause C2, further comprising a gate conductor disposed conformally on the protrusions so as to overlie at least part of the dielectric layer.

Clause C4. The wafer of clause C3, wherein the gate conductor comprises a conductive 2D material.

Clause C5. The wafer of clause C1, further comprising:

a dielectric layer disposed conformally on the protrusions so as to underlie at least part of the semiconductor 2D material layer; and a 2D gate conductor layer disposed conformally on the protrusions so as to underlie at least part of the dielectric layer.

Clause C6. The wafer of clause C1, wherein one of the protrusion comprises a ridge extending vertically from a substrate, the ridge having tree-shaped cross-section.

Clause CM1. A method of forming a wafer for the fabrication of integrated circuits, comprising:

providing on a substrate a first plurality of elongated parallel protrusions, each of the protrusions elongated in a respective longitudinal dimension and further having a respective transverse dimension, each of the protrusions further having at least first and second non-coplanar surfaces also elongated in the respective longitudinal dimension and disposed transversely from one another on the respective protrusion; and forming a semiconductor 2D material layer conformally on the protrusions so as to overlie at least the first and second surfaces of each of the protrusions, at least along respective longitudinal segments of the respective protrusion.

This aspect of the invention further includes dependent aspects corresponding to the dependent aspects mentioned above under Clause C1.

Clause D1. A wafer comprising:

a first plurality of elongated parallel protrusions on a substrate, each of the protrusions elongated in a respective longitudinal dimension and further having a respective transverse dimension, each of the protrusions further having at least first and second non-coplanar surfaces also elongated in the respective longitudinal dimension and disposed transversely from one another on the respective protrusion, wherein the first and second non-coplanar surfaces of each of the protrusions comprise longitudinally alternating conductive and dielectric segments.

Clause D2. The wafer of clause D1, wherein all surfaces of each of the protrusions comprise longitudinally alternating conductive and dielectric segments.

Clause D3. The wafer of clause D1, wherein each of the protrusions comprises longitudinally alternating conductive and dielectric volumes.

Clause D4. The wafer of clause D1, further comprising a dielectric layer disposed conformally on the protrusions so as to overlie at least the first and second surfaces of each of the protrusions, at least along respective longitudinal segments overlying the conductive segments of the protrusions.

Clause D5. The wafer of clause D4, further comprising a semiconductor 2D material layer disposed conformally on the protrusions so as to overlie at least the first and second surfaces of each of the protrusions, at least along respective longitudinal segments of the respective protrusion, the dielectric layer separating the semiconductor 2D material layer from at least the conductive segments of the protrusions.

Clause D6. The wafer of clause D3, further comprising:

a dielectric layer disposed conformally on the protrusions so as to overlie each of the protrusions; and a semiconductor 2D material layer disposed conformally on the protrusions so as to overlie the dielectric layer.

Clause D7. The wafer of clause D1, wherein one of the protrusion comprises a ridge extending vertically from a substrate, the ridge having tree-shaped cross-section.

Clause DM1. A method for making a wafer for the fabrication of integrated circuits, comprising:

providing a substrate; and forming on the substrate a first plurality of elongated parallel protrusions, each of the protrusions elongated in a respective longitudinal dimension and further having a respective transverse dimension, each of the protrusions further having at least first and second non-coplanar surfaces also elongated in the respective longitudinal dimension and disposed transversely from one another on the respective protrusion, wherein the first and second non-coplanar surfaces of each of the protrusions comprise longitudinally alternating conductive and dielectric segments.

This aspect of the invention further includes dependent aspects corresponding to the dependent aspects mentioned above under Clause D1.

Clause E1. A plurality of FinFETs formed on parallel fins sharing a substrate, the fins having a pitch that is no greater than 18.4 nm.

Clause E2. The plurality of FinFETs of clause E1, wherein the fins have a pitch that is no greater than 17.2 nm.

Clause E3. The plurality of FinFETs of clause E1, wherein the fins have a pitch that is no greater than 14.4 nm.

Clause EM1. A method of making an integrated circuit device, comprising:

providing a plurality of parallel ridges on a substrate, the ridges having a pitch that is no greater than 18.4 nm; and processing the substrate to form transistors in the ridges.

Clause EM2. The method of clause EM1, wherein the ridges have a pitch that is no greater than 17.2 nm.

Clause EM3. The method of clause EM1, wherein the ridges have a pitch that is no greater than 17.2 nm.

Clause F1. An article of manufacture comprising:

a machine readable data storage medium storing in a non-transitory manner a plurality of software code portions defining logic for selecting a design entry for an integrated circuit from a library including a plurality of design entries, entries in the library including specifications of particular cells in a computer readable description language, at least one entry in the library comprising:

a specification for use with a an intermediate product having a first plurality of elongated parallel protrusions on a substrate, each of the protrusions elongated in a respective longitudinal dimension and further having a respective transverse dimension, each of the protrusions further having at least first and second non-coplanar surfaces disposed transversely from one another on the protrusion, the intermediate product further having a semiconductor 2D material layer disposed conformally on the protrusions so as to overlie at least the first and second surfaces of each of the protrusions, at least along respective longitudinal segments of the respective protrusion, wherein the specification defines longitudinal regions along at least one of the protrusions at which at least the semiconductor 2D material layer is to be removed, and positions for formation of source, gate and drain terminals.

Clause G1. An article of manufacture comprising:

a machine readable data storage medium storing in a non-transitory manner a plurality of software code portions defining logic for selecting a design entry for an integrated circuit from a library including a plurality of design entries, entries in the library including specifications of particular cells in a computer readable description language, at least one entry in the library comprising:

a specification for a macrocell which includes a longitudinal segment of semiconductor material, and a gate conductor crossing the segment of semiconductor material transversely, the specification terminating the segment of semiconductor material at a first longitudinal end without a dummy gate conductor at the first longitudinal end.

Clause G2. The article of clause G1, wherein the specification further terminates the segment of semiconductor material at a second end longitudinally opposite the first longitudinal end without a dummy gate conductor at the second longitudinal end.

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. An integrated circuit structure having a transistor device which comprises:
   a three-dimensional body having longitudinal and transverse dimensions and further having at least first and second non-coplanar surfaces disposed transversely from one another on the body;
   a semiconductor 2D material layer disposed conformally on the body so as to overlie at least the first and second surfaces along a particular longitudinal segment of the body;
   source and drain terminals connected to the device, at least one of the source and drain terminals connected to the semiconductor 2D material layer; and
   a gate conductor connected to a gate terminal and underlying a channel portion of the semiconductor 2D material layer.

2. The structure of claim 1, wherein the body comprises a three-dimensional conductive volume disposed longitudinally between first and second three-dimensional dielectric volumes of the body, the gate conductor including the three-dimensional conductive volume,
   wherein the 2D semiconductor material layer has a channel region overlying at least part of the conductive volume and further having source and drain regions overlying respectively the first and second dielectric volumes, the channel region being separated from at least the conductive volume by a gate dielectric layer,
   wherein the source and drain terminals are connected to the source and drain regions of the semiconductor 2D material layer, and the gate terminal is connected to the conductive volume.

3. The structure of claim 2, wherein the three-dimensional conductive volume comprises a metal.

4. The structure of claim 2, wherein the three-dimensional conductive volume comprises a heavily doped semiconductor.

5. The structure of claim 2, wherein the gate dielectric layer comprises a 2D material layer.

6. The structure of claim 2, wherein the gate terminal is offset transversely from a line joining the source and drain terminals.

7. The structure of claim 1, wherein the body is a dielectric,
   wherein the semiconductor 2D material layer includes a channel region disposed longitudinally between source and drain regions of the semiconductor 2D material layer,
   wherein the gate conductor is disposed conformally on the body so to underlie the channel region and transversely so as to overlie both the first and second surfaces, the gate conductor separated from the semiconductor 2D material layer by a gate dielectric layer,
   and wherein the source, gate and drain terminals are connected to the source region, the gate conductor, and the drain region, respectively.

8. The structure of claim 7, wherein the gate conductor comprises a 2D material layer.

9. The structure of claim 7, wherein the gate dielectric layer comprises a 2D material layer.

10. The structure of claim 7, wherein the gate terminal is offset transversely from a line joining the source and drain terminals.

11. The structure of claim 1, wherein the first and second non-coplanar surfaces are separated from each other transversely.

12. The structure of claim 1, wherein the three-dimensional body comprises a ridge extending vertically from a substrate, the ridge having first and second opposite walls and a top,
    wherein the first and second non-coplanar surface are disposed on the first and second walls, respectively.

13. The structure of claim 1, wherein the three-dimensional body comprises a ridge extending vertically from a substrate, the ridge having first and second opposite walls and a top,
    wherein the first and second non-coplanar surface are disposed on the first wall and the top, respectively.

14. The structure of claim 1, wherein the three-dimensional body comprises a plurality of transversely adjacent parallel ridges each extending vertically from a substrate, each of the ridges having two opposite walls and a respective peak between them, and each transversely adjacent pair of the parallel ridges joined transversely by a respective valley.

15. The structure of claim 14, wherein the semiconductor 2D material overlies all of the walls, peaks and valleys of the plurality of ridges within the particular longitudinal segment of the body.

16. The structure of claim 14, wherein the semiconductor 2D material overlies all of the walls and valleys of the plurality of ridges, but not any of the peaks of the plurality of ridges, within the particular longitudinal segment of the body.

17. The structure of claim 14, wherein the first and second non-coplanar surface are disposed on extreme transversely opposite walls of the plurality of ridges.

18. The structure of claim 1, wherein the three-dimensional body comprises a ridge extending vertically from a substrate, the ridge having tree-shaped cross-section.

19. The structure of claim 18, wherein the semiconductor 2D material layer is disposed conformally on all surfaces of the ridge along the particular longitudinal segment of the body.

20. The structure of claim 18, wherein the cross-sectional shape includes a vertical trunk section and at least one branch extending transversely from the trunk section.

21. The structure of claim 18, wherein the cross-sectional shape includes a vertical trunk section having a plurality of branches extending transversely from the trunk section, an upper one of the branches overlying a lower one of the branches and separated vertically from the lower branch by a recess.

22. The structure of claim 21, wherein the upper and lower branches each have upper, lower and end surfaces,
and wherein the semiconductor 2D material layer is disposed conformally on the upper and end surfaces of both the upper and lower branches along the particular longitudinal segment of the body.

23. The structure of claim 21, wherein the upper and lower branches each have upper, lower and end surfaces, and wherein the trunk section has a top surface,
and wherein the semiconductor 2D material layer is disposed conformally on the top surface and the upper and end surfaces of both the upper and lower branches along the particular longitudinal segment of the body.

24. The structure of claim 18, further having a second transistor device having a second three-dimensional body which comprises a second ridge extending vertically from the substrate, the second ridge having a smooth walled cross-section.

25. The structure of claim 24, wherein the tree-shaped cross-section includes a vertical trunk section and at least one branch extending transversely from the trunk section, each of the branches having a respective upper, lower and end surface,
wherein the semiconductor 2D material layer is disposed conformally on at least the upper and end surfaces of each of the branches along the particular longitudinal segment of the body
and wherein the semiconductor 2D material layer is disposed conformally on at least the walls of the second ridge.

26. The structure of claim 18, wherein the cross-sectional shape of the three-dimensional body includes a vertical trunk and exactly N>0 branches extending in one transverse direction from the trunk, the branches superposing one another and each vertically adjacent pair of the branches separated vertically from each other by a respective recess,
the structure further having a second transistor device having a second three-dimensional body which comprises a second ridge extending vertically from the substrate, the second ridge having second tree-shaped cross-section,
the second cross-sectional shape including a second vertical trunk having exactly M>0 second branches extending in one transverse direction from the second trunk, the second branches superposing one another and each vertically adjacent pair of the second branches separated vertically from each other by a respective recess,
where M≠N.

27. The structure of claim 26, wherein the cross-sectional shape of the second three-dimensional body further has a branch extending from the second trunk in a direction transversely opposite that of the second branches.

28. The structure of claim 26, wherein each of the branches has a respective upper, lower and end surface,
and wherein the semiconductor 2D material layer is disposed conformally on at least the upper and end surfaces of each of the branches along a longitudinal segment of the body.

29. A method of making an integrated circuit structure having a transistor device, comprising:
providing a three-dimensional body having longitudinal and transverse dimensions and further having at least first and second non-coplanar surfaces disposed transversely from one another on the body;
forming a semiconductor 2D material layer conformally on the body so as to overlie at least the first and second surfaces along a particular longitudinal segment of the body;
forming source and drain terminals connected to the device, at least one of the source and drain terminals being connected to the semiconductor 2D material layer; and
forming a gate conductor connected to a gate terminal and underlying a channel portion of the semiconductor 2D material layer.

30. The method of claim 29, wherein the body comprises a three-dimensional conductive volume disposed longitudinally between first and second three-dimensional dielectric volumes of the body, the gate conductor including the three-dimensional conductive volume,
wherein the 2D semiconductor material layer has a channel region overlying at least part of the conductive volume and further having source and drain regions overlying respectively the first and second dielectric volumes, the channel region being separated from at least the conductive volume by a gate dielectric layer,
wherein forming source and drain terminals connected to the device comprises connecting the source and drain terminals to the source and drain regions of the semiconductor 2D material layer,
and wherein forming a gate conductor connected to a gate terminal comprises connecting the gate terminal to the conductive volume.

31. The method of claim 29, wherein the body is a dielectric,
wherein the semiconductor 2D material layer includes a channel region disposed longitudinally between source and drain regions of the semiconductor 2D material layer,
wherein the gate conductor is disposed conformally on the body so to underlie the channel region and transversely so as to overlie both the first and second surfaces, the gate conductor separated from the semiconductor 2D material layer by a gate dielectric layer,
and wherein the source, gate and drain terminals are connected to the source region, the gate conductor, and the drain region, respectively.

32. The method of claim 31, wherein the gate conductor comprises a 2D material layer.

33. The method of claim 29, wherein the three-dimensional body comprises a ridge extending vertically from a substrate, the ridge having tree-shaped cross-section.

34. The method of claim 33, wherein the semiconductor 2D material layer is disposed conformally on all surfaces of the ridge along the particular longitudinal segment of the body.

35. The method of claim 33, further comprising forming a second transistor device having a second three-dimensional body which comprises a second ridge extending vertically from the substrate, the second ridge having a smooth walled cross-section.

36. The method of claim 33, wherein the cross-sectional shape of the three-dimensional body includes a vertical trunk and exactly N>0 branches extending in one transverse direction from the trunk, the branches superposing one another and each vertically adjacent pair of the branches separated vertically from each other by a respective recess, the method further comprising forming a second transistor device having a second three-dimensional body which comprises a second ridge extending vertically from the substrate, the second ridge having second tree-shaped cross-section, the second cross-sectional shape including a second vertical trunk having exactly M>0 second branches extending in one transverse direction from the second trunk, the second branches superposing one another and each vertically adjacent pair of the second branches separated vertically from each other by a respective recess, where M≠N.

37. An integrated circuit transistor device comprising:
a first ridge having longitudinal and transverse dimensions, the first ridge having first and second opposite sidewalls and a peak;
a semiconductor 2D material layer disposed conformally on the ridge so as to overlie at least the first and second sidewalls of the first ridge along a particular longitudinal segment of the ridge;
source and drain terminals connected to the device, at least one of the source and drain terminals connected to the semiconductor 2D material layer; and
a gate conductor connected to a gate terminal and underlying a channel portion of the semiconductor 2D material layer.

38. The device of claim 37, wherein the first ridge comprises a three-dimensional conductive volume disposed longitudinally between first and second three-dimensional dielectric volumes of the first ridge, the gate conductor including the three-dimensional conductive volume,
wherein the 2D semiconductor material layer has a channel region overlying at least part of the conductive volume and further having source and drain regions overlying respectively the first and second dielectric volumes, the channel region being separated from at least the conductive volume by a gate dielectric layer,
wherein the source and drain terminals are connected to the source and drain regions of the semiconductor 2D material layer, and the gate terminal is connected to the conductive volume.

39. The device of claim 37, wherein the first ridge is a dielectric,
wherein the semiconductor 2D material layer includes a channel region disposed longitudinally between source and drain regions of the semiconductor 2D material layer,
wherein the gate conductor is disposed conformally on the first ridge so to underlie the channel region and transversely so as to overlie both the first and second surfaces, the gate conductor separated from the semiconductor 2D material layer by a gate dielectric layer,
and wherein the source, gate and drain terminals are connected to the source region, the gate conductor, and the drain region, respectively.

40. The device of claim 39, wherein the gate conductor comprises a 2D material layer.

41. The device of claim 37, wherein the first ridge has a tree-shaped cross-section.

42. The device of claim 41, further comprising a second ridge extending parallel to the first ridge, the second ridge having a smooth walled cross-section.

43. The device of claim 41, wherein the cross-sectional shape of the first ridge includes a vertical trunk and exactly N>0 branches extending in one transverse direction from the trunk, the branches superposing one another and each vertically adjacent pair of the branches separated vertically from each other by a respective recess,
the device further having a second transistor device formed on a second ridge extending parallel to the first ridge, the second ridge having a second cross-sectional shape,
the second cross-sectional shape including a second vertical trunk having exactly M>0 second branches extending in one transverse direction from the second trunk, the second branches superposing one another and each vertically adjacent pair of the second branches separated vertically from each other by a respective recess,
where M≠N.

44. A method of making an integrated circuit transistor device comprising:
providing a first ridge having longitudinal and transverse dimensions, the first ridge having first and second opposite sidewalls and a peak;
forming a semiconductor 2D material layer conformally on the ridge so as to overlie at least the first and second sidewalls of the first ridge along a particular longitudinal segment of the ridge;
forming source and drain terminals connected to the device, at least one of the source and drain terminals connected to the semiconductor 2D material layer; and
forming a gate conductor connected to a gate terminal and underlying a channel portion of the semiconductor 2D material layer.

45. The method of claim 44, wherein the first ridge comprises a three-dimensional conductive volume disposed longitudinally between first and second three-dimensional dielectric volumes of the first ridge, the gate conductor including the three-dimensional conductive volume,
wherein the 2D semiconductor material layer has a channel region overlying at least part of the conductive volume and further having source and drain regions overlying respectively the first and second dielectric volumes, the channel region being separated from at least the conductive volume by a gate dielectric layer,
wherein the source and drain terminals are connected to the source and drain regions of the semiconductor 2D material layer, and the gate terminal is connected to the conductive volume.

46. The method of claim 44, wherein the first ridge is a dielectric,
wherein the semiconductor 2D material layer includes a channel region disposed longitudinally between source and drain regions of the semiconductor 2D material layer,
wherein the gate conductor is disposed conformally on the first ridge so to underlie the channel region and transversely so as to overlie both the first and second surfaces, the gate conductor separated from the semiconductor 2D material layer by a gate dielectric layer,
and wherein the source, gate and drain terminals are connected to the source region, the gate conductor, and the drain region, respectively.

47. The method of claim 44, wherein the first ridge has a tree-shaped cross-section.

* * * * *